US012276912B2

(12) United States Patent
Hwang et al.

(10) Patent No.: US 12,276,912 B2
(45) Date of Patent: Apr. 15, 2025

(54) UV- AND HEAT-CURABLE LADDER-LIKE POLYSILSESQUIOXANE COPOLYMER, INSULATION COMPOSITION CONTAINING SAME AND METHOD FOR FORMING MICROCIRCUIT PATTERN USING SAME

(71) Applicant: KOREA INSTITUTE OF SCIENCE AND TECHNOLOGY, Seoul (KR)

(72) Inventors: Seung Sang Hwang, Seoul (KR); Soon Man Hong, Seoul (KR); Kyung Youl Baek, Seoul (KR); Chong Min Koo, Seoul (KR); Albert Lee, Seoul (KR); Seon Joon Kim, Seoul (KR); You Mee Choi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 808 days.

(21) Appl. No.: 17/384,200

(22) Filed: Jul. 23, 2021

(65) Prior Publication Data
US 2022/0372231 A1 Nov. 24, 2022

(30) Foreign Application Priority Data

May 7, 2021 (KR) .................. 10-2021-0058994

(51) Int. Cl.
| | | |
|---|---|---|
| G03F 7/075 | (2006.01) | |
| C08G 77/04 | (2006.01) | |
| C08G 77/18 | (2006.01) | |
| C08G 77/20 | (2006.01) | |
| C08G 77/28 | (2006.01) | |
| H01B 3/30 | (2006.01) | |

(52) U.S. Cl.
CPC ......... *G03F 7/0758* (2013.01); *C08G 77/045* (2013.01); *C08G 77/18* (2013.01); *C08G 77/28* (2013.01); *H01B 3/307* (2013.01)

(58) Field of Classification Search
CPC ..... G03F 7/0758; G03F 7/0757; C08G 77/18; C08G 77/20; C08G 77/28
See application file for complete search history.

(56) References Cited

U.S. PATENT DOCUMENTS

| | | | |
|---|---|---|---|
| 2005/0159533 A1* | 7/2005 | Nabeshima | ............. C08L 51/00 524/495 |
| 2019/0112409 A1* | 4/2019 | Miyachi | ............... C08F 290/067 |
| 2021/0095124 A1* | 4/2021 | Iizuka | ..................... C09J 151/08 |

FOREIGN PATENT DOCUMENTS

| | | | | |
|---|---|---|---|---|
| KR | 10-0794961 B1 | | 1/2008 | |
| KR | 2008176037 A | * | 7/2008 | ........... G03F 7/0757 |
| KR | 10-2048495 B1 | | 11/2019 | |
| KR | 10-2021-0024840 A | | 3/2021 | |

OTHER PUBLICATIONS

You-Mee Choi et al., "Photosensitive hybrid polysilsesquioxanes for etching-free processing of flexible copper clad laminate", Composites Science and Technology, Jan. 5, 2021, pp. 1-9, vol. 108556, No. 201.

* cited by examiner

*Primary Examiner* — John S. Chu
(74) *Attorney, Agent, or Firm* — Rabin & Berdo, P.C.

(57) ABSTRACT

The present disclosure relates to a UV- and heat-curable ladder-like polysilsesquioxane copolymer and a method for preparing the same. Since a controlled functionality can be provided only on a desired region via a thiol-ene click reaction without an additional additive, an insulating layer having a low dielectric constant and a microcircuit pattern can be formed without an additional etching process.

12 Claims, 14 Drawing Sheets

Negatively Patterned Surface
Non-plated Hybrid Low-k Surface

UV- AND HEAT-CURABLE LADDER-LIKE POLYSILSESQUIOXANE COPOLYMER, INSULATION COMPOSITION CONTAINING SAME AND METHOD FOR FORMING MICROCIRCUIT PATTERN USING SAME

CROSS-REFERENCE TO RELATED APPLICATIONS

This application claims priority under 35 U.S.C. § 119 to Korean Patent Application No. 10-2021-0058994 filed on May 7, 2021 in the Korean Intellectual Property Office, the disclosure of which is incorporated herein by reference in its entirety.

TECHNICAL FIELD

The present disclosure relates to a UV- and heat-curable ladder-like polysilsesquioxane copolymer and a method for preparing the same. More particularly, the present disclosure may provide an insulation composition using a polysilsesquioxane copolymer having a thiol group and an ene group at the same time, which can be used as an insulating layer for a printed circuit board and as a layer for selective plating patterning, and a method for forming a microcircuit pattern using the same.

BACKGROUND

A printed circuit board (PCB) is an essential component for integration of electronic products. It is growing rapidly as the IT environment is expanding on the basis of the Fourth Industrial Revolution. One of the core technology of the printed circuit board is to embody a microcircuit (fine pattern).

In order to form a circuit pattern on the printed circuit board, the etching-based subtractive method is used the most frequently. After forming a pattern on a copper-clad laminate (copper foil) or a metal-clad laminate using a photosensitive film (dry film), a circuit pattern is formed by removing the copper or metal on the unnecessary part by etching the same. Since the etching process involves side etching, micropatterning is difficult because the width of the circuit pattern on the upper side is smaller than that on the lower side.

The semi-additive process (SAP) has been developed to overcome this problem. After forming a thin copper (Cu) plating layer with a thickness of 2-3 µm on a copper film-removed insulating layer by electroless copper plating and then forming a pattern using a photosensitive film (dry film), a circuit is formed through electroplating. Then, the photosensitive film (dry film) on the undesired region is removed by flash etching. Although the semi-additive method allows formation of fine circuits as compared to the subtractive method, there are still the problem that side etching occurs and a process for removing a palladium catalyst is necessary.

In order to solve these problems, the modified semi-additive process (MSAP) of forming a pattern on an ultra-thin copper layer and removing the ultrathin copper layer by etching with a sulfuric acid-oxygen peroxide solvent has been developed. However, the problem of side etching cannot be avoided since an etching process is necessary and other problems occur such as low adhesivity of the copper film due to the use of the ultrathin copper film with small roughness and nonuniformity of pattern due to the difficulty of distance control.

In addition, the rough copper film remaining on the insulating layer may result in skin effect whereby signal loss occurs at high frequencies.

In order to solve the above-described problems of the prior art, an insulating layer which has a low dielectric constant and allows direct plating patterning without an etching process is necessary, and development of an insulating layer material that can satisfy the two characteristics described above is necessary.

REFERENCES OF THE RELATED ART

Patent Documents

Patent document 1. Korean Patent Publication No. 10-2008-0004107.
Patent document 2. Korean Patent Publication No. 10-2019-0113115.
Patent document 3. Korean Patent Publication No. 10-2021-0024840.

SUMMARY

The present disclosure is directed to providing a ladder-like polysilsesquioxane with a new structure, which has a thiol group and an allyl group at the same time, and a method for preparing the same.

The present disclosure is also directed to providing an insulation composition which has superior heat resistance at high temperature, allows easy formation of a pattern with high sensitivity and high resolution, has excellent substrate adhesivity and flatness, and has a low dielectric constant.

The present disclosure is also directed to providing a method for forming a microcircuit pattern using the ladder-like polysilsesquioxane.

The present disclosure provides a ladder-like polysilsesquioxane copolymer having a thiol group and an ene group protected with a silyl group, which is represented by Chemical Formula 1:

[Chemical Formula 1]

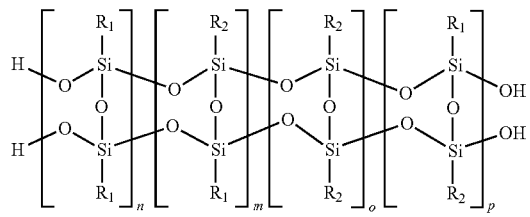

In Chemical Formula 1, $R_1$ is selected from an aromatic mercapto group protected with a silyl group and an aliphatic mercapto group protected with a silyl group, $R_2$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-30}$ aryl group and a substituted or unsubstituted $C_{2-15}$ heteroaryl group, and each of n, m, o and p is independently an integer from 1 to 10,000.

$R_1$ may be selected from a $C_{1-20}$ linear or branched mercaptoalkyl group protected with a silyl group, and $R_2$ may be selected from a $C_{1-20}$ alkenyl group.

$R_1$ may be selected from a $C_{1-6}$ mercaptoalkyl group protected with a silyl group, and $R_2$ may be selected from a $C_{1-6}$ alkenyl group.

$R_1$ is selected from a $C_{1-6}$ linear mercaptoalkyl group protected with a silyl group, $R_2$ may be selected from $H_2C=C(H)-R_3-*$, and $R_3$, which is identical or different from each other, may be selected from hydrogen and a $C_{1-6}$ alkyl group.

In Chemical Formula 1, the silyl group of $R_1$ may be $R_4R_5R_6Si-*$, which is a protecting group that can be deprotected under a strongly acidic condition, and each of $R_4$, $R_5$ and $R_6$, which are identical or different from each other, may be independently selected from hydrogen, a $C_{1-6}$ linear or branched alkyl group, a $C_{1-5}$ alkoxy group, a cyano group, a $C_{6-30}$ aryl group and a $C_{2-10}$ acyl group.

The ladder-like polysilsesquioxane copolymer may have a number-average molecular weight of 10,000-40,000.

The polysilsesquioxane copolymer may have a molecular weight distribution (polydispersity index, $M_w/M_n$) of 4-7.

The ladder-like polysilsesquioxane copolymer may show a mass loss of less than 5 wt % below 370° C. in thermogravimetric analysis (TGA).

In Chemical Formula 1, each of n, m, o and p may be independently an integer from 1 to 10,000.

The present disclosure also provides a method for preparing a ladder-like polysilsesquioxane copolymer, which includes:

(1) a step of synthesizing a ladder-like polysilsesquioxane copolymer by condensation polymerizing a trialkoxysilane monomer having a thiol group protected with a silyl group, represented by Chemical Formula 2, and a trialkoxysilane monomer substituted with an allyl group, represented by Chemical Formula 3, in the presence of water and a catalyst in an organic solvent:

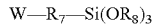  [Chemical Formula 2]

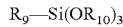  [Chemical Formula 3]

wherein $R_7$ is selected from an aromatic thiol group or an aliphatic thiol group, $R_9$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-15}$ aryl group and a substituted or unsubstituted $C_{2-15}$ heteroaryl group, each of $R_8$ and $R_{10}$, which are identical or different from each other, is independently selected from a $C_{1-6}$ alkyl group, and W is $R_{11}R_{12}R_{13}Si-$, wherein each of $R_{11}$, $R_{12}$ and $R_{13}$, which are identical or different from each other, is independently selected from hydrogen, a $C_{1-6}$ linear or branched alkyl group, a $C_{1-5}$ alkoxy group, a cyano group, a $C_{6-30}$ aryl group and a $C_{2-10}$ acyl group.

$R_7$ may be selected from a $C_{1-20}$ linear or branched mercaptoalkyl group.

$R_9$ may be selected from a $C_{1-6}$ alkenyl group.

$R_7$ may be selected from a $C_{1-6}$ linear mercaptoalkyl group, $R_8$ may be selected from $H_2C=C(H)-R_{14}-*$, and $R_{14}$ may be independently selected from hydrogen and a $C_{1-6}$ alkyl group.

A molar ratio of the trialkoxysilane monomer having a thiol group, represented by Chemical Formula 2, and the trialkoxysilane monomer substituted with an allyl group, represented by Chemical Formula 3, may be from 8:2 to 2:8.

The organic solvent may be one or more selected from a group consisting of tetrahydrofuran (THF), dimethylformamide (DMF), acetonitrile, acetone, methyl ethyl ketone (MEK), methyl isobutyl ketone (MIBK), dimethyl sulfoxide (DMSO), dimethylacetamide (DMAc) and N-methylpyrrolidone (NMP).

The catalyst may be selected from a group consisting of potassium hydroxide, sodium hydroxide, triethylamine, sodium bicarbonate, potassium carbonate, pyridine and a mixture thereof.

The polymerization may be performed at 10-100° C.

The method may further include, after the step (1), a step of purifying the ladder-like polysilsesquioxane copolymer.

The present disclosure also provides an insulation composition including: (a) a ladder-like polysilsesquioxane copolymer; (b) an acid; (c) a radical initiator; and (d) an organic solvent.

The acid may be selected from a group consisting of phosphoric acid, citric acid, formic acid, acetic acid, trifluoroacetic acid and tetrabutylammonium fluoride.

The organic solvent may be one or more selected from a group consisting of tetrahydrofuran (THF), dimethylformamide (DMF), acetonitrile, acetone, methyl ethyl ketone (MEK), methyl isobutyl ketone (MIBK), dimethyl sulfoxide (DMSO), dimethylacetamide (DMAc) and N-methylpyrrolidone (NMP).

The radical initiator may be one or more selected from a group consisting of Irgacure 184, Irgacure 369, Irgacure 379, Irgacure 651, Irgacure 819, Irgacure 907, Irgacure 2959, Irgacure OXE01, Lucirin TPO (all available from BASF), benzoin methyl ether, benzoin ethyl ether and benzoin isopropyl ether.

The present disclosure also provides a method for preparing a microcircuit pattern, which includes:

(A) a step of coating the insulation composition on a substrate;

(B) a step of heating the coating layer to remove impurities;

(C) a step of covering a patterning mask on the activated coating layer and curing the coating layer along a pattern by exposing to UV; and (D) a step of separating the patterning mask and performing electroless plating.

The substrate may be selected from a group consisting of glass, a polycarbonate (PC) film, a polymer substrate, a ceramic substrate and a zirconia (zirconium oxide) substrate.

The electroless plating may be performed using a metal-precipitating solution containing a metal ion salt, a reducing agent and a stabilizer.

The electroless plating may skip an etching process.

An insulating layer prepared by the preparation method may have a dielectric constant of 1-3 at 1 GHz and 0.01-0.03 at 15 GHz.

A microcircuit pattern prepared by the preparation method may have a minimum linewidth limit of 4 μm and a surface resistivity of 1-10 μΩcm.

An insulating layer prepared by the preparation method may have a surface roughness (Ra) of 0.1-0.5 nm.

The present disclosure also provides an electromagnetic shielding material, flexible circuit board, component or device including a microcircuit pattern prepared by the preparation method.

The present disclosure also provides a ladder-like polysilsesquioxane copolymer represented by Chemical Formula 4.

Chemical Formula 4

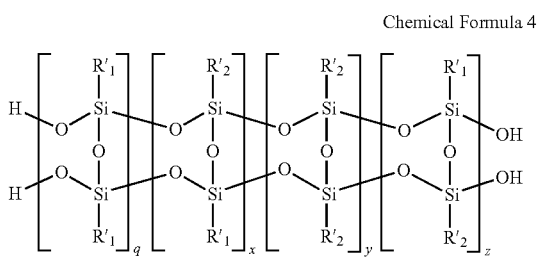

In Chemical Formula 4, $R_1'$ is selected from an aromatic mercapto group and an aliphatic mercapto group, $R_2'$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-30}$ aryl group and a substituted or unsubstituted $C_{2-15}$ heteroaryl group, all or part of $R_1'$ and all or part of $R_2'$ are bonded by a click reaction, and each of q, x, y and z is independently an integer from 1 to 10,000.

The present disclosure also provides a method for preparing a copolymer, which includes: (A) a step of deprotecting the silyl protecting group of the ladder-like polysilsesquioxane copolymer; and (B) a step of performing a click reaction between the deprotected thiol group and the ene group.

The click reaction may be initiated by light.

The click reaction may be performed selectively only on an unmasked region.

Since the present disclosure provides a ladder-like polysilsesquioxane of a new structure having a thiol group and an ene group at the same time, controlled functionality can be provided only at a desired region through a thiol-ene click reaction without an additional additive. Therefore, an insulating layer having a low dielectric constant can be provided and the functionality of forming a microcircuit pattern can be embodied without an additional etching process.

In addition, an insulation composition prepared from the ladder-like polysilsesquioxane of the present disclosure allows the formation of a pattern with excellent heat resistance, high sensitivity and high resolution and the formation of a microcircuit pattern having a lower roughness than a laminated copper film.

Accordingly, the insulation composition of the present disclosure can be usefully used for various industrial applications as a new hybrid material.

BRIEF DESCRIPTION OF DRAWINGS

FIG. 8A shows a plating pattern prepared from a square patterning mask with a size of 7 μm$^2$, FIG. 8B shows a plating pattern prepared from a square patterning mask with a size of 70 μm$^2$, and FIG. 8C shows a positive plating pattern prepared from a square patterning mask with a size of 70 μm$^2$.

FIG. 9A shows a plating pattern prepared from a line patterning mask with a linewidth of 6 μm, FIG. 9B shows a plating pattern prepared from a line patterning mask with a linewidth of 5 μm, FIG. 9C shows a plating pattern prepared from a line patterning mask with a linewidth of 4 μm linewidth, and FIG. 9D shows a plating pattern prepared from a line patterning mask with a linewidth of 2 μm.

DETAILED DESCRIPTION OF EMBODIMENTS

Figure 1A:
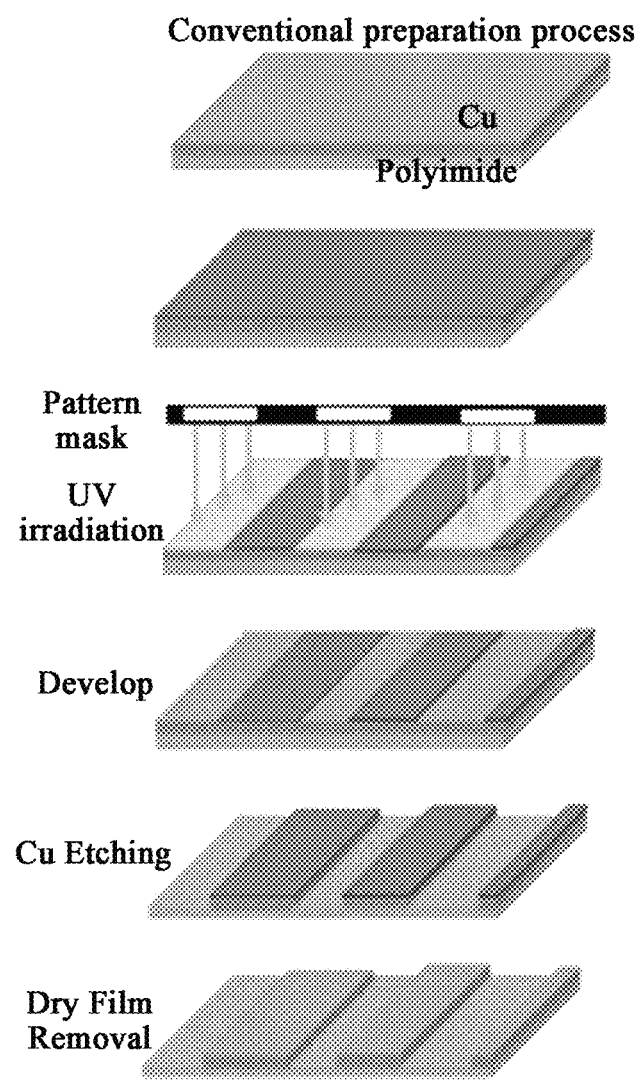
FIG. 1A schematically shows the existing process of preparing a microcircuit pattern, and FIG. 1B schematically shows a process of preparing a microcircuit pattern using a ladder-like polysilsesquioxane of the present disclosure.

Hereinafter, specific exemplary embodiments of the present disclosure are described in detail such that those having ordinary knowledge in the art to which the present disclosure belong can easily carry out the present disclosure.

For synthesis of a photosensitive ladder-like polysilsesquioxane copolymer which allows selective electroless plating by exposure to UV and has a low dielectric constant, it is necessary to design a ladder-like polysilsesquioxane copolymer having a thiol group and an allyl group at the same time. However, it is difficult to control the thiol group and the allyl group because they form thiol-ene due to radical sensitivity. Accordingly, it is impossible to synthesize a ladder-like polysilsesquioxane copolymer by copolymerizing the two monomers directly. The inventors of the present disclosure have made efforts to make the synthesis of ladder-like polysilsesquioxane copolymer easy and enable selective plating through deprotection and UV exposure by lowering the radical sensitivity of the thiol functional group, and have completed the present disclosure.

An aspect of the present disclosure relates to a ladder-like polysilsesquioxane copolymer with a thiol group and an ene group protected with a silyl group, which is represented by Chemical Formula 1.

[Chemical Formula 1]

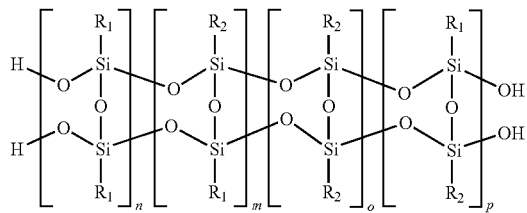

In Chemical Formula 1, $R_1$ is selected from an aromatic mercapto group protected with a silyl group and an aliphatic mercapto group protected with a silyl group, $R_2$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-30}$ aryl group and a substituted or unsubstituted $C_{2-15}$ heteroaryl group, and each of n, m, o and p is independently an integer from 1 to 10,000.

Because $R_1$ and $R_2$ react 1:1, in Chemical Formula 1, each of n, m, o and p may be independently an integer selected from 1 to 10,000 except the case where the number of the repeat unit wherein $R_1$ is included is 0 or the number of the repeat unit wherein $R_2$ is included is 0, although not being specially limited thereto. Outside the above range, plating with superior thermal stability, a superior dielectric constant and low dielectric loss becomes difficult.

In the present disclosure, the aromatic mercapto group may be 1-benzylthiol, naphthalene-1-thiol, anthracene-1-thiol, etc., although not being limited thereto.

In addition, the aliphatic mercapto group may be specifically a $C_{1-20}$ aliphatic mercapto group, e.g., propylthiol, butylthiol or hexylthiol, although not being limited thereto.

In the present disclosure, 'aliphatic' is a concept relative to aromatic, and refers to a non-aromatic group, compound, etc.

In the present disclosure, 'alkenyl' refers to a compound having a double bond in the main chain of the compound. The alkenyl group refers to a linear or branched group having 1-20, specifically 1-16, more specifically 2-14, further more specifically 2-12, even more specifically 2, 3, 4, 5 or 6, carbon atoms, which has one or more conjugated or unconjugated carbon-carbon double bond, specifically 1, 2 or 3 carbon-carbon double bonds, the remainder of the molecule being liked by a single bond. Examples may include an allyl group, a vinyl group, an oleyl group, a linoleyl group and similar groups.

In the present disclosure, 'alkynyl' refers to a group including at least one carbon-carbon triple bond. Examples may include an ethynyl group, a n-1-propynyl group, a n-2-propynyl group, a n-1-butynyl group, a n-2-butynyl group, a n-3-butynyl group, a 1-methyl-2-propynyl group, a n-1-pentynyl group, a n-2-pentynyl group, a n-3-pentynyl group, a n-4-pentynyl group, a 1-methyl-nbutynyl group, a 2-methyl-n-butynyl group, a 3-methyl-n-butynyl group, a 1,1-dimethyl-n-propynyl group, a n-1-hexynyl group, a n-1-decynyl group, a n-1-pentadecynyl group, a n-1-eicosynyl group, etc.

In the present disclosure, 'arene' refers to a hydrocarbon group having an aromatic ring, which has specifically 6-30, more specifically 6-20, particularly specifically 6-16, carbon atoms. Examples may include a benzene group, a naphthalene group, an anthracene group, a phenanthrene group, a pyrene group or a terphenyl group.

In the present disclosure 'aryl' refers to a compound having an intramolecular ring structure. The aryl group refers to an aromatic group which having 6-30, specifically 6-18, more specifically 6-10, further more specifically 6 or 10, carbon atoms, and may contain 1, 2, 3 or 4 aromatic rings linked or fused by carbon-carbon bonds, the remainder of the molecule being liked by a single bond. Examples may include phenyl, naphthyl, diphenyl, indenyl, phenanthryl or anthryl.

In the present disclosure, 'heteroaryl' may refer to a heteroaryl containing 1-4 heteroatoms selected from a group consisting N, O and S, specifically one or more N, unless defined otherwise. Examples of monocyclic heteroaryl may include thiazole, oxazole, thiophene, furan, pyrrole, imidazole, isoxazole, isothiazole, pyrazole, triazole, triazine, thiadiazole, tetrazole, oxadiazole, pyridine, pyridazine, pyrimidine, pyrazine and similar groups, although not being limited thereto. Examples of acyclic heteroaryl may include indole, indoline, benzothiophene, benzofuran, benzimidazole, benzoxazole, benzisoxazole, benzothiazole, benzothiadiazole, benzotriazole, quinoline, isoquinoline, purine, furopyridine and similar groups, although not being limited thereto.

In the present disclosure, 'alkyl' refers to an aliphatic hydrocarbon radical. The alkyl may be 'saturated alkyl' not containing an alkenyl or alkynyl moiety or 'unsaturated alkyl' containing at least one alkenyl or alkynyl moiety. Unless defined otherwise, the alkyl group may be lower alkyl having 1-6 carbon atoms, specifically an alkyl group having 1-3 carbon atoms.

In the present disclosure, 'alkoxy' refers to alkyloxy having 1-6 carbon atoms, specifically 1-3 carbon atoms, unless defined otherwise.

In the present disclosure, a 'cyano group' refers to a radical represented by —CN, which has a carbon atom triple-bonded to a nitrogen atom. It may form hydrogen cyanide, a metal cyanide or a nitrile by bonding to another atom or functional group.

In the present disclosure, an 'acyl group' refers to a moiety of a carboxylic acid with OH removed (i.e., —CO), and includes, for example, an acetyl group, a propionyl group or a butyryl group.

In the present disclosure, 'substituted' in 'substituted or unsubstituted' means substitution with one or more substituent selected from a group consisting of deuterium, a halogen, an amino group, a nitrile group, a nitro group, a $C_{1-20}$ alkyl group, a $C_{1-20}$ alkoxy group, a $C_{1-20}$ alkylamine group, a $C_{1-20}$ alkylthiophene group, a $C_{6-20}$ arylthiophene group, a $C_{2-20}$ alkenyl group, a $C_{2-20}$ alkynyl group, a $C_{3-20}$ cycloalkyl group, a $C_{6-20}$ aryl group, a silane group, a boron group, and a $C_{2-20}$ heterocyclic group containing at least one heteroatom selected from a group consisting of O, N, S, Si and P, although not being limited thereto.

Among 100 mol % of the sum of $R_1$ and $R_2$, the content of an aromatic mercapto group protected with a silyl group or an aliphatic mercapto group protected with a silyl group may be 30-60 mol %, specifically 40-50 mol %.

$R_1$ may be selected from a $C_{1-20}$ linear or branched mercaptoalkyl group protected with a silyl group. Specifically, $R_1$ may be selected from a $C_{1-6}$ mercaptoalkyl group protected with a silyl group. More specifically, it may be selected from a $C_{1-6}$ linear mercaptoalkyl group protected with a silyl group. Most specifically, it may be a linear mercaptopropyl group protected with a silyl group.

In the present disclosure, the mercaptoalkyl group may be an alkyl group with all or some of hydrogen atoms substituted with mercapto groups. For example, it may be an alkyl group selected from methyl, ethyl, propyl, isopropyl, butyl, pentyl and hexyl groups, with all or some of hydrogen atoms substituted with mercapto groups.

Specifically, it may be a mercaptomethyl group, a mercaptoethyl group or a mercaptopropyl group, although not being limited thereto. Most specifically, it may be a linear mercaptopropyl group.

$R_2$ may be selected from a $C_{1-2}$ alkenyl group. Specifically, it may be selected from a $C_{1-6}$ alkenyl group, specifically from an allyl group, a vinyl group, an oleyl group and a linoleyl group. More specifically, $R_2$ may be selected from $H_2C=C(H)-R_3-*$, wherein $R_3$ is selected from hydrogen and a $C_{1-6}$ alkyl group.

In the present disclosure, in Chemical Formula 1, the silyl group of $R_1$ may be $R_4R_5R_6Si-*$, which is a protecting group that can be deprotected under a strongly acidic condition, and each of $R_4$, $R_5$ and $R_6$, which are identical or different from each other, may be independently selected from hydrogen, a $C_{1-6}$ linear or branched alkyl group, a $C_{1-5}$ alkoxy group, a cyano group, a $C_{6-30}$ aryl group and a $C_{2-10}$ acyl group.

In the present disclosure, all or some hydrogen atoms of the thiol group of the mercaptoalkyl group of $R_1$ may be substituted with silyl groups. The silyl group may be selected from a group consisting of a trimethylsilyl group, a triethylsilyl group, a tert-butyldimethylsilyl group, a tert-butyldiphenylsilyl group and a triisopropylsilyl group. Since the thiol group and the allyl group of the ladder-like polysilsesquioxane are highly reactive, a stable protecting group is necessary for synthesis of a polysilsesquioxane having a thiol group and an allyl group at the same time by a general chemical reaction. As the protecting group of the mercaptoalkyl group, a silyl group is preferred because it can be removed easily under a strongly acidic condition and a mild condition at room temperature.

80-99% of the total mercaptoalkyl groups of the ladder-like polysilsesquioxane of the present disclosure may be substituted with silyl groups.

The silyl group not only prevents unwanted side reactions but also prevents a click reaction between the thiol group and the allyl group and improves compatibility under mild reaction conditions.

Among the silyl groups, a tert-butyldimethylsilane group is the most preferred because it can be easily deprotected under hydrophobic, strongly acidic and high-temperature conditions.

Since the ladder-like polysilsesquioxane of the present disclosure is synthesized by hydrolysis-polycondensation under a basic condition of pH 11, the protecting group should be stable under a basic condition. The tert-butyldimethylsilane group is the most preferred because it is very stable even under a basic condition.

The ladder-like polysilsesquioxane of the present disclosure, which contains a thiol group and an ene group at the same time on the side chain, allows the formation of a desired microcircuit pattern via a 'thiol-ene click reaction' between the thiol group and the allyl group after coating only through selective exposure to UV without addition of an additive.

In the present disclosure, the ladder-like polysilsesquioxane allows the formation of a flexible copper-clad laminate through electroless copper plating. Because the ladder-like polysilsesquioxane of the present disclosure has a thiol group and an allyl group at the same time, an insulating layer exhibiting a low dielectric constant and low loss behavior and a desired microcircuit pattern can be formed at the same time without an etching process since the region exposed to UV forms a thioether bridge (—S—S—) via a thiol-ene click reaction and the region not exposed to UV acts as a seed initiator for electroless copper plating.

In the present disclosure, the ladder-like polysilsesquioxane copolymer may have a number-average molecular weight of 10,000-40,000.

In the present disclosure, the ladder-like polysilsesquioxane copolymer may have a molecular weight distribution (polydispersity index, $M_w/M_n$) of 4-7.

The ladder-like polysilsesquioxane copolymer may show a mass loss of less than 5 wt % below 370° C. in thermogravimetric analysis (TGA).

In the present disclosure, the ladder-like polysilsesquioxane may be a copolymer having a regular ladder structure.

Another aspect of the present disclosure relates to a method for preparing a ladder-like polysilsesquioxane copolymer, which includes:

(1) a step of synthesizing a ladder-like polysilsesquioxane copolymer by condensation polymerizing a trialkoxysilane monomer having a thiol group protected with a silyl group, represented by Chemical Formula 2, and a trialkoxysilane monomer substituted with an allyl group, represented by Chemical Formula 3, in the presence of water and a catalyst in an organic solvent:

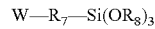 [Chemical Formula 2]

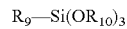 [Chemical Formula 3]

wherein $R_7$ is selected from an aromatic thiol group or an aliphatic thiol group, $R_9$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-15}$ aryl group and a substituted or unsubstituted $C_{2-15}$ heteroaryl group, each of $R_8$ and $R_{10}$, which are identical or different from each other, is independently selected from a $C_{1-6}$ alkyl group, and W is $R_{11}R_{12}R_{13}Si-$, wherein each of $R_{11}$, $R_{12}$ and $R_{13}$, which are identical or different from each other, is independently selected from hydrogen, a $C_{1-6}$ linear or branched alkyl group, a $C_{1-5}$ alkoxy group, a cyano group, a $C_{6-30}$ aryl group and a $C_{2-10}$ acyl group.

$R_7$ may be selected from a $C_{1-20}$ linear or branched mercaptoalkyl group.

$R_9$ may be selected from a $C_{1-6}$ alkenyl group.

Specifically, $R_7$ may be selected from a linear mercaptopropyl group, $R_9$ may be selected from $H_2C=C(H)-R_{14}-*$, and $R_{14}$ may be independently selected from hydrogen and a $C_{1-6}$ alkyl group.

A molar ratio of the trialkoxysilane monomer having a thiol group, represented by Chemical Formula 2, and the trialkoxysilane monomer substituted with an allyl group, represented by Chemical Formula 3, may be from 8:2 to 2:8, specifically from 7:3 to 3:7, more specifically from 6:4 to 4:6, most specifically 5:5.

Even when a trialkoxysilane monomer having a thiol group, represented by Chemical Formula 2, which is not protected with a silyl group, is used, the ladder-like polysilsesquioxane copolymer is synthesized although at a low yield. However, the ladder-like polysilsesquioxane copolymer prepared from the monomer cannot be stored for a long time in solid or liquid state because it is unstable at room temperature. In addition, because it is cured via a click reaction between the thiol group and the allyl group prior to selective plating by exposure to UV, it cannot be used to form a desired pattern.

The organic solvent may be a polar solvent that can be uniformly mixed with water. Specifically, it may be one or more selected from a group consisting of tetrahydrofuran (THF), dimethylformamide (DMF), acetonitrile, dichloromethane (DCM), acetone, methyl ethyl ketone (MEK), methyl isobutyl ketone (MIBK), dimethyl sulfoxide (DMSO), dimethylacetamide (DMAc) and N-methylpyrrolidone (NMP), more specifically dimethylformamide (DMF).

The catalyst may be an alkali catalyst, and the alkali catalyst may be selected from a group consisting of potassium hydroxide, sodium hydroxide, triethylamine, sodium bicarbonate, potassium carbonate, pyridine and a mixture thereof, more specifically potassium hydroxide or potassium carbonate, most specifically potassium carbonate.

The concentration of the catalyst is not limited as long as the desired reaction can proceed. For example, the catalyst may be used at a concentration of 0.0001-50 mol % based on the molar concentration of the trialkoxysilane monomer represented by Chemical Formula 2.

The polymerization may be performed at any temperature. Specifically, it may be performed at a temperature of 10-100° C.

The completion of the polymerization may be identified by GPC. It is preferred that the polymerization is performed until there is no more increase in molecular weight.

After the step (1), a step of purifying the ladder-like polysilsesquioxane copolymer may be further included. In the purification step of the present disclosure, a method not using water may be used to prevent the hydrolysis of trialkoxysilane. For example, filtration, chromatography, precipitation, neutralization, etc. may be used, although not being limited thereto.

The number-average molecular weight ($M_n$) and molecular weight distribution ($M_w/M_n$) of the polymerized ladder-like polysilsesquioxane of the present disclosure may be measured with the JASCO PU-2080 plus SEC system equipped with a refractive index detector (RI-2031 plus) and a UV detector ($\lambda$=254 nm, UV-2075 plus). And, the synthesized ladder-like polysilsesquioxane may be subjected to $^1$H-NMR, $^{13}$C-NMR and $^{29}$Si NMR analysis to verify that the polymerization has been performed completely.

Figure 7:
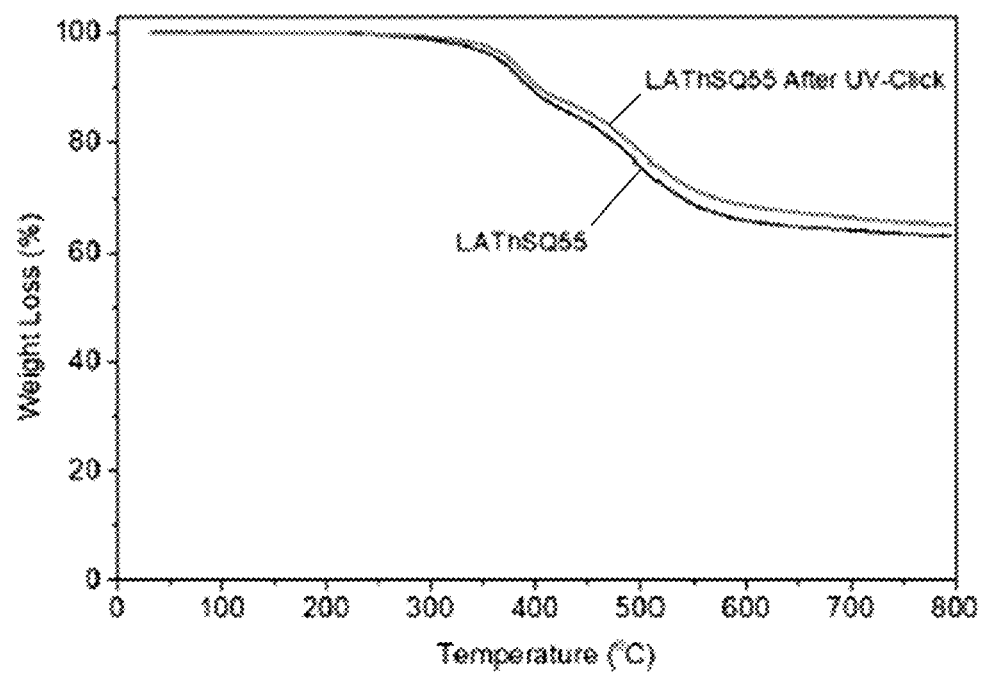
FIG. 7 shows the TGA analysis result of a LAThPSQ55 copolymer prepared in Example 2-1 and a LAThPSQ55 copolymer prepared in Example 2-1 after coating on a Si wafer, heating (120° C., 10 minutes) and curing by exposure to UV.

In addition, the presence of defects (irregularities resulting from terminal —OH and unreacted alkoxy) and thermal stability may be confirmed by performing TGA from room temperature to 800° C. (FIG. 7).

A ladder-like polysilsesquioxane having a thiol group and an allyl group at the same time may be synthesized using the polymerization method of the present disclosure.

Another aspect of the present disclosure relates to an insulation composition containing: (a) the ladder-like polysilsesquioxane copolymer; (b) an acid; (c) a radical initiator; and (d) an organic solvent.

The composition may contain 20-40 wt % of the ladder-like polysilsesquioxane copolymer (a), 20-40 wt % of the acid (b) and 25-45 wt % of the organic solvent (d), and the radical initiator (c) may be contained in an amount of 0.1-0.5 part by weight based on 1 part by weight of the ladder-like polysilsesquioxane copolymer (a). For long-term storage, the acid (b) may be stored in a separate or separated container and then may be mixed when preparing the insulating layer.

The ladder-like polysilsesquioxane copolymer may be a ladder-like polysilsesquioxane copolymer prepared by condensation polymerizing 30-60 mol % of a trialkoxysilane monomer having a thiol group protected with a silyl group, represented by Chemical Formula 2, and 40-70 mol % of a trialkoxysilane monomer substituted with an allyl group, represented by Chemical Formula 3.

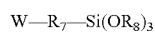  [Chemical Formula 2]

  [Chemical Formula 3]

In Chemical Formulas 2 and 3, $R_7$ is selected from an aromatic thiol group or an aliphatic thiol group, $R_9$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-15}$ aryl group and a substituted or unsubstituted $C_{2-15}$ heteroaryl group, each of $R_8$ and $R_{10}$, which are identical or different from each other, is independently selected from a $C_{1-6}$ alkyl group, and W is $R_{11}R_{12}R_{13}Si-$ wherein each of $R_{11}$, $R_{12}$ and $R_{13}$, which are identical or different from each other, is independently selected from hydrogen, a $C_{1-6}$ linear or branched alkyl group, a $C_{1-5}$ alkoxy group, a cyano group, a $C_{6-30}$ aryl group and a $C_{2-10}$ acyl group.

A more detailed description will be replaced by the foregoing description about the ladder-like polysilsesquioxane copolymer.

The acid may be selected from a group consisting of phosphoric acid, citric acid, formic acid, acetic acid, trifluoroacetic acid and tetrabutylammonium fluoride.

The organic solvent may be a polar solvent that can be mixed uniformly with water, specifically one or more selected from a group consisting of tetrahydrofuran (THF), dimethylformamide (DMF), acetonitrile, acetone, methyl ethyl ketone (MEK), methyl isobutyl ketone (MIBK), dimethyl sulfoxide (DMSO), dimethylacetamide (DMAc) and N-methylpyrrolidone (NMP), more specifically dichloromethane (DCM).

Specifically, the radical initiator may be a radical photopolymerization initiator, although not being specially limited thereto. The radical photopolymerization initiator may be a benzophenone-based compound, an acetophenone-based compound, an acylphosphine oxide-based compound, a titanocene-based compound, an oxime ester-based compound, a benzoin ether-based compound, thioxanthone, etc. The radical photopolymerization initiator may be one which is commercially available, for example, one or more selected from a group consisting of Irgacure 184, Irgacure 369, Irgacure 379, Irgacure 651, Irgacure 819, Irgacure 907, Irgacure 2959, Irgacure OXE01, Lucirin TPO (all available from BASF), benzoin methyl ether, benzoin ethyl ether and benzoin isopropyl ether. Among them, one selected from a group consisting of Irgacure 651, Irgacure 819, Irgacure 907, Irgacure OXE01 and Lucirin TPO is preferred in that the absorption wavelength range is broad. These radical photopolymerization initiators may be used either alone or in combination.

As soon as the acid is added to the insulation composition, a deprotection reaction whereby the silyl group is removed occurs slowly. Since the deprotection reaction is performed under a mild condition of 5-50° C., the protecting group is removed completely under the acidic condition without a heating process and the ladder-like polysilsesquioxane copolymer is activated.

But, after the insulation composition is coated, it is preferred to pass through a heating process at high temperature prior to exposure to UV in order to remove impurities. The heat treatment may be performed at 100-200° C., specifically at 100-150° C. If the heat treatment temperature is below 100° C., condensation may not occur between the substrate and the hydroxy group (OH). And, if it exceeds 150° C., microcracking may occur due to thermal expansion and shrinkage. The heat treatment may be performed for 1-60 minutes, specifically for 5-20 minutes.

Figure 6:
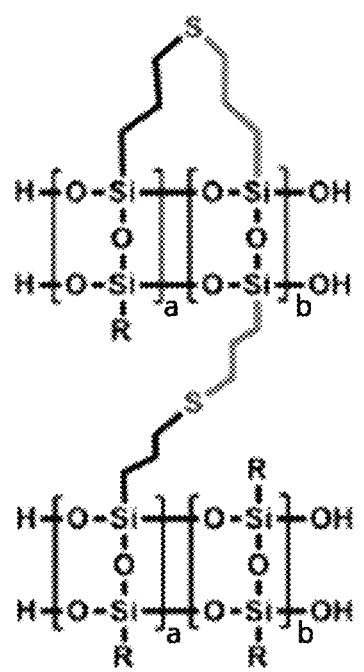
FIG. 6 shows the chemical structure of a LAThPSQ55 copolymer of Example 2-1 cured by exposure to UV.

If the activated insulation composition is exposed to UV, a thio-ether bridge (—S—S—) is formed via a click reaction between the thiol group and the unsaturated allyl functional group. Through this, an insulating film having hydrophobicity and a low dielectric constant is formed (FIG. 6). In contrast, the region not exposed to UV acts as a positively patterned template for selective electroless copper plating since the thiol group remains intact.

The insulation composition according to the present disclosure has a low dielectric constant, high thermal stability, high adhesion strength to a copper film, low expansibility and superior mechanical properties. In addition, it allows the formation of a microcircuit with a desired pattern by exposure to UV without an etching process.

Accordingly, the composition can be applied to a printed circuit board, a copper-clad laminate, etc. However, the use of the composition is not limited thereto.

Another aspect of the present disclosure relates to a method for preparing a microcircuit pattern, which includes:
- (A) a step of coating the insulation composition on a substrate;
- (B) a step of heating the coating layer to remove impurities;
- (C) a step of covering a patterning mask on the activated coating layer and curing the coating layer along a pattern by exposing to UV; and
- (D) a step of separating the patterning mask and performing electroless plating.

Figure 1B:
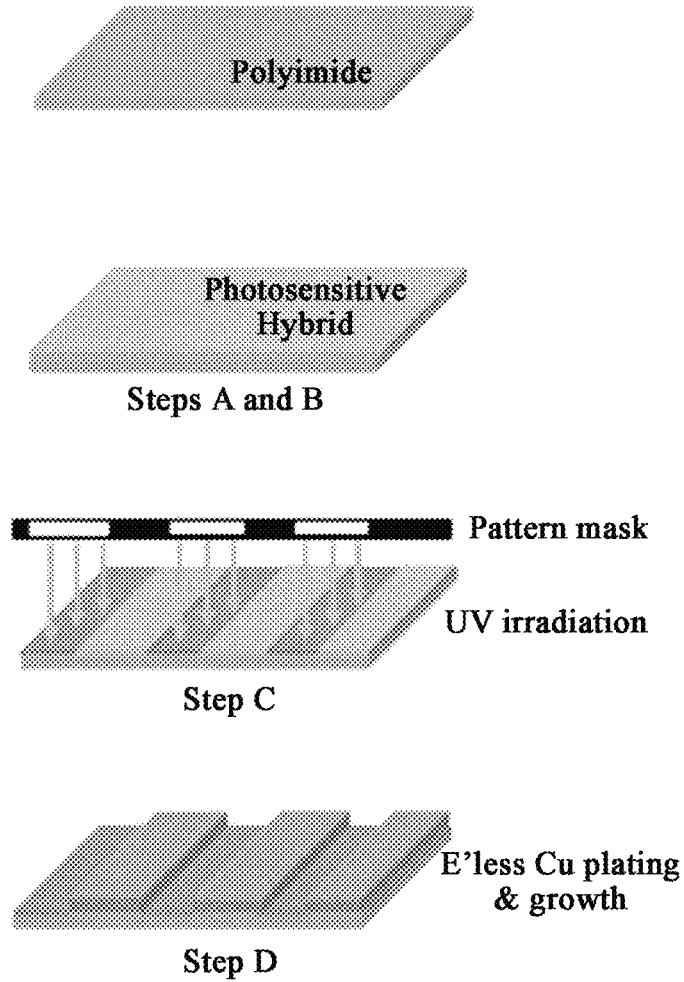
Figure 2:
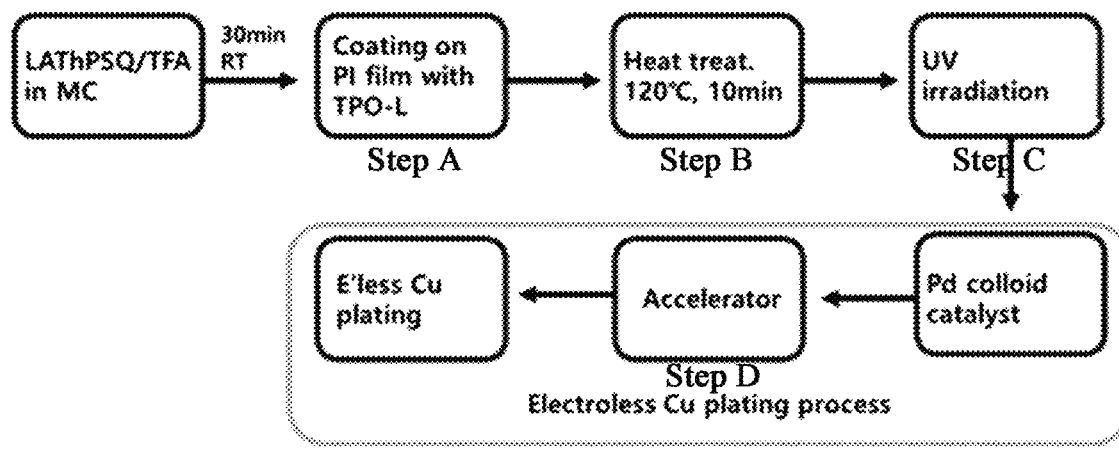
FIG. 2 schematically shows a process of preparing a microcircuit pattern using a ladder-like polysilsesquioxane of the present disclosure.

The method for preparing a microcircuit pattern of the present disclosure is illustrated in FIG. 1 and FIG. 2. It will be described specifically referring to the figures.

First, the insulation composition is mixed and coated on a substrate (A).

Specifically, the deprotection of the thiol group is induced by removing the silyl group of the ladder-like polysilsesquioxane copolymer at room temperature by mixing the insulation composition. When the coating layer is heated, the coating layer is activated as the protecting group of the thiol group bonded to the acid contained in the composition is removed. The deprotection of the ladder-like polysilsesquioxane of the present disclosure copolymer occurs only under a strongly acidic condition. Because the ladder-like polysilsesquioxane exists stably under a basic condition, the thiol group can be protected sufficiently during the polymerization process and the ladder-like polysilsesquioxane has superior long-term stability.

An insulating layer is formed by coating the insulation composition of the present disclosure on the substrate to a predetermined thickness.

The substrate may be any one selected from a group consisting of glass, a metal and a plastic, without special limitation. Specifically, it may be any one selected from a group consisting of glass, a polycarbonate (PC) film, a polymer substrate, a ceramic substrate, a zirconia (zirconium oxide) substrate, a silicon wafer, an aluminum substrate, a copper substrate, an alloy substrate, a sapphire substrate, a diamond substrate, a glass optical fiber, an optical waveguide, a glass fiber fabric and a glass fiber nonwoven, although not being limited thereto.

The coating method is not specially limited as long as the purpose of the present disclosure is not hindered. Specifically, spin coating, dip coating, spray coating, flow coating, bar coating, sputtering, microcoating, roll-to-roll coating, RIP coating or screen printing may be used.

Next, the coating layer is heated to remove impurities (B).

After the coating is completed, impurities may be removed by evaporating the solvent. The removal step may be performed simply by drying the coating layer to ambient environment, applying vacuum during the initial step of a curing process, or heating the coating layer at a relatively low temperature of 200° C. or below.

The step (B) may be performed by heating at 100-200° C. for 1-60 minutes, specifically at 100-150° C. for 1-30 minutes, more specifically at 110-130° C. for 5-15 minutes.

Next, a patterning mask is covered on the activated coating layer and the coating layer is cured along a pattern by exposing to UV (C).

That is to say, after covering a patterning mask having a prepared pattern on the activated coating layer, UV is irradiated onto the patterning mask, so that —S—S— is formed via a click reaction between the thiol group and the unsaturated allyl functional group and an insulating film having hydrophobicity and a low dielectric constant is formed on the region exposed to UV. The region not exposed to UV acts as a seed initiator for electroless copper plating since the thiol group remains intact. As a result, the desired pattern can be formed.

Finally, electroless plating is performed after separating the patterning mask (D). The electroless plating method is not specially limited as long as a metal is reduced and deposited on the substrate using a solution wherein a metal ion-containing compound and a reducing agent are mixed.

Specifically, the electroless plating process include: i) a step of immersing in an electroless metal plating solution; ii) a step of immersing in an aqueous sulfuric acid solution; and iii) a step of immersing in a copper-precipitating solution. The present disclosure is advantageous over the existing electroless plating method in that an etching process is omitted because electroless plating is possible without an additional etching process.

First, the substrate with the patterning mask separated may be immersed in an electroless metal plating solution for 1-60 minutes (step i)).

The electroless metal plating solution contains a palladium salt, hydrochloric acid and distilled water. Specifically, a mixing ratio of the palladium salt, hydrochloric acid and distilled water may be 1:1-5:10-20, specifically 1:4:15, based on volume.

Next, the substrate may be immersed in an aqueous sulfuric acid solution after it is taken out from the electroless metal plating solution and washed with distilled water (step ii)). A mixing ratio of sulfuric acid and distilled water in the aqueous sulfuric acid solution may be 1:1-10, specifically 1:5-10, most specifically 1:7.5, based on volume.

The step ii) may be performed for 1-60 minutes, specifically for 1-10 minutes. Pd/Sn seeding is performed through the steps i) and ii).

Finally, a metal-precipitating solution is prepared by mixing a metal ion salt, a stabilizer and a reducing agent (e.g., formalin) in distilled water and then the substrate is immersed therein for 10-60 minutes.

The metal-precipitating solution may be a mixture solution of 10-30 wt % of copper sulfate ($CuSO_4$) as the metal ion salt and 1-15 wt % of sulfuric acid in distilled water. If necessary, 0.1-5 wt % of gluconic acid and/or 1-10 wt % of Rochelle salt may be added as a complexing agent. In this case, the content of the distilled water is decreased.

As the stabilizer, 10-30 wt % of EDTA or a hydroxide (specifically, NaOH) is mixed with distilled water. If necessary, 1-10 wt % of nickel sulfate ($NiSO_4$) as a brightener and/or 10-30 wt % of Rochelle salt as a complexing agent may be added. In this case, the content of the distilled water is decreased.

0.1-30 mL of a polypyrrolidone-based stabilizer (M) may be added to the copper-precipitating solution. For example, 0.01-5 wt % of 'polypyrrolidone K-30' mixed in distilled water may be used.

As shown in FIG. 2, electroless copper plating is achieved as copper ion is reduced on the surface of the pattern not exposed to UV.

The most important feature of the present disclosure is that metal plating is formed selectively only with exposed to UV without an etching process. Specifically, on the region where the insulating layer is exposed to UV, plating is not formed since the thiol group is blocked due to sulfidation via a click reaction of the thiol group and the allyl group. In contrast, plating is formed uniformly on the region of the insulating layer that is not exposed to UV since the thiol group remains intact due to the absence of a click reaction between the thiol group and the allyl group. The images and experimental examples verifying this will be described in detail later referring to FIGS. 9A to 9D and FIGS. 10A to 10B.

Since the method for forming a microcircuit according to the present disclosure allows formation of an insulating layer and a flexible copper-clad laminate at the same time through a single photolithographic process, it can simply the production process and reduce production cost. In addition, it provides advantages in terms of sensitivity, resolution, processing margin, minimum linewidth, flatness, etc. and allows the preparation of a high-density pattern without increase in surface resistance or cracking. Therefore, it can be usefully applied to various applications.

The US (line/space) limit of the existing processes is ~30 μm for the subtractive process, ~20 μm for the semi-additive process (SAP), and ~10 μm for the modified semi-additive process (MSAP). In contrast, the method for forming a microcircuit of the present disclosure allows the formation of micro patterns of 10 μm or smaller, with a minimum linewidth limit of 4 μm and the surface resistivity of the pattern of 1-10 μΩcm.

In addition, an insulating layer prepared from the preparation method has low dielectric constant properties, with a dielectric constant of 1-3 at 1 GHz and 0.01-0.03 at 15 GHz.

An insulating layer prepared from the preparation method has a surface roughness (Ra) of 0.1-0.5 nm, which is about ⅕ of the surface roughness of a polyimide film.

Another aspect of the present disclosure relates to a ladder-like polysilsesquioxane copolymer represented by Chemical Formula 4.

[Chemical Formula 4]

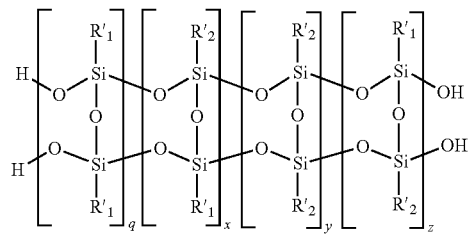

In Chemical Formula 4, $R_1'$ is selected from an aromatic mercapto group and an aliphatic mercapto group, $R_2'$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-30}$ aryl group and a substituted or unsubstituted $C_{2-15}$ heteroaryl group, all or part of $R_1'$ and all or part of $R_2'$ are bonded by a click reaction, and each of q, x, y and z is independently an integer from 1 to 10,000.

Since the ladder-like polysilsesquioxane of the present disclosure copolymer represented by Chemical Formula 4 can be cured easily through light irradiation in short time, has superior stretching properties and elasticity and has a low dielectric constant, it can be used as an insulating layer material, a new hybrid material for microcircuit patterning, etc.

The ladder-like polysilsesquioxane copolymer represented by Chemical Formula 4 according to the present disclosure may experience initiation of a thiol-ene click reaction by light. Upon light irradiation, all or part of $R_1'$ and all or part of $R_2'$ may be bonded by a click reaction through spontaneous photocuring.

$R_1'$ may be selected from a $C_{1-20}$ linear or branched mercaptoalkyl group. $R_1'$ may be specifically a $C_{1-6}$ mercaptoalkyl group, more specifically $C_{1-6}$ a linear mercaptoalkyl group, most specifically a linear mercaptopropyl group.

In the present disclosure, the mercaptoalkyl group may be a functional group with all or part of the hydrogen atoms of an alkyl group substituted with mercapto groups. For example, all or part of the hydrogen atoms of an alkyl group selected from methyl, ethyl, propyl, isopropyl, butyl, pentyl and hexyl groups may be substituted with mercapto groups. Specifically, the mercaptoalkyl group may be a mercaptomethyl group, a mercaptoethyl group or a mercaptopropyl group, although not being limited thereto. Most specifically, it may be linear mercaptopropyl as described above.

$R_2'$ may be selected from a $C_{1-20}$ alkenyl group, specifically from a $C_{1-6}$ alkenyl group, more specifically from an allyl group, a vinyl group, an oleyl group and a linoleyl group. More specifically, $R_2'$ may be selected from $H_2C=C(H)-R_3'-*$, wherein $R_3'$ is selected from hydrogen and a $C_{1-6}$ alkyl group.

In the ladder-like polysilsesquioxane copolymer, the region exposed to UV forms a thioether bridge (—S—S—) via a thiol-ene click reaction, thereby forming a non-patterning region where copper is not plated during electroless copper plating. Therefore, an insulating layer exhibiting a low dielectric constant and low loss behavior can be formed.

Because $R_1'$ and $R_2'$ react 1:1, in Chemical Formula 4, each of q, x, y and z may be independently an integer selected from 1 to 10,000 except the case where the number of the repeat unit wherein $R_1'$ is included is 0 or the number of the repeat unit wherein $R_2'$ is included is 0, although not being specially limited thereto. Outside the above range, plating with superior thermal stability, a superior dielectric constant and low dielectric loss becomes difficult.

Another aspect of the present disclosure relates to a method for preparing a ladder-like polysilsesquioxane copolymer, which includes:

(A) a step of deprotecting the silyl protecting group of a ladder-like polysilsesquioxane copolymer represented by Chemical Formula 1; and (B) a step of performing a click reaction between the deprotected thiol group and an ene group.

[Chemical Formula 1]

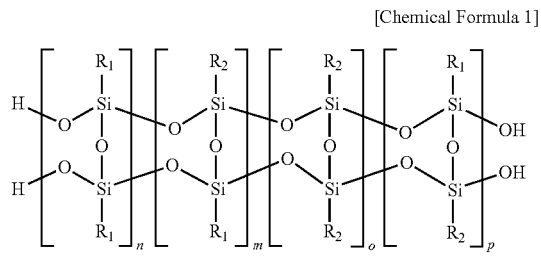

In Chemical Formula 1, $R_1$ is selected from an aromatic mercapto group protected with a silyl group and an aliphatic mercapto group protected with a silyl group, $R_2$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-30}$ aryl group and a substituted or unsubstituted $C_{2-15}$ heteroaryl group, and each of n, m, o and p is independently an integer from 1 to 10,000.

The method for preparing a ladder-like polysilsesquioxane copolymer represented by Chemical Formula 1 will be described while avoiding redundancy.

First, the silyl protecting group of a ladder-like polysilsesquioxane copolymer represented by Chemical Formula 1 is deprotected (A).

The step (A) may be performed under an acidic condition.

The acid may be selected from a group consisting of phosphoric acid, citric acid, formic acid, acetic acid, trifluoroacetic acid and tetrabutylammonium fluoride.

In the step (A), as soon as the acid is added, a deprotection reaction whereby the silyl group is removed from the ladder-like polysilsesquioxane copolymer represented by Chemical Formula 1 occurs slowly. Since the deprotection reaction is performed under a mild condition of 5-50° C., the protecting group is removed completely under the acidic condition without a heating process and the ladder-like polysilsesquioxane copolymer is activated.

Then, a click reaction is performed between the deprotected thiol group and an ene group (B). The click reaction is initiated by light. Specifically, when the activated ladder-like polysilsesquioxane copolymer represented by Chemical Formula 1 is exposed to UV, a thio-ether bridge (—S—S—) is formed via a click reaction between the thiol group and the unsaturated allyl functional group (ene group). Through this, an insulating film exhibiting hydrophobicity and a low dielectric constant is formed. In contrast, the region not exposed to UV acts as a positively patterned template for selective electroless copper plating since the thiol group remains intact.

Hereinafter, the present disclosure is described in more detail through examples. However, the examples are only for illustrating the present disclosure and the scope of the present disclosure is not limited by them.

EXPERIMENTAL METHODS $^1$H-NMR, $^{13}$C-NMR and $^{29}$Si NMR measurement was made at 25° C. using Varian Unity INOVA ($^1$H: 400 MHz, $^{13}$C: 75 MHz, $^{29}$Si: 59.6 MHz) with CDCl$_3$ as a solvent. FT-IR measurement was made by preparing a solvent cast film on KBr pellets using a Perkin-Elmer FT-IR system (Spectrum-GX).

Thermal gravimetric analysis (TGA) was performed using TA Instruments TGA 295 to measure weight loss under $N_2$ atmosphere at a flow rate of 60 mL/min.

The number-average molecular weight ($M_n$) and molecular weight distribution ($M_w/M_n$) of the polymer were measured with a JASCO PU-2080 plus SEC system equipped with a refractive index detector (RI-2031 plus) and a UV detector (λ=254 nm, UV-2075 plus) using THF as a mobile phase at 40° C., with a flow rate of 1 mL/min.

Samples used for the analysis were separated through four columns (Shodex-GPC KF-802, KF-803, KF-804, KF-805).

Field emission scanning electron microscopy (FESEM) images to verify the morphology and shape of patterned copper were taken on Inspect F50 (FEI, Korea). The surface was coated with platinum under vacuum prior to the analysis.

Atomic force microscopy (AFM) measurement was made with XE-100 (Park Systems, Korea) using an NCHR cantilever at a non-contact mode. Dielectric properties were measured with an RF impedance/material analyzer (Agilent, E4991A).

Example 1-1. Thiol-Based Silane Monomer Protected with TBDMS (tert-butyldimethylsilyl) Group (Protected 3-MPTMS)

[Scheme 1]

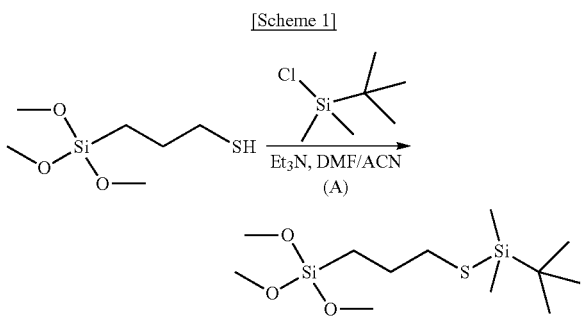

The following reaction was performed to protect the thiol group of 3-MPTMS ((3-mercaptopropyl)trimethoxysilane, Gelest, 99%) with a TBDMS (tert-butyldimethylsilyl) group. Specifically, TBSCl (tert-butyldimethylsilyl chloride, Aldrich, 97%) (46.05 g, 0.305 mol) and DMF (100 g)/ACN (1000 g) were mixed in a round-bottom flask. After adding 3-MPTMS ((3-mercaptopropyl)trimethoxysilane, Gelest, 99%) (40.00 g, 0.203 mol), the mixture was stirred for 1 hour. When the stirred solution became transparent, the reaction temperature was lowered using an ice bath while maintaining stirring. While stirring, Et$_3$N (triethylamine, Aldrich, 99.5%) (37.10 g, 0.366 mol) was added dropwise. After removing the ice bath, the mixture was stirred at room temperature for 48 hours. Because removal of the Et$_3$NHCl salt using water can cause hydrolysis of the protected silane monomer, the Et$_3$NHCl salt was removed through multiple filtering without using water. Then, in order to minimize the effect by atmospheric moisture, filtering was performed twice using a cannula filter system. The filtered reaction solution was evaporated at 60° C. to remove the organic solvent such as DMF. After adding excess cold ethyl acetate (EA) thereto, the mixture was kept in at 4° C. overnight to precipitate the unremoved salt. After removing the precipitated salt using a cannula filter, ethyl acetate was removed by evaporation. A purified solid was obtained by repeating the procedure of adding excess cold ethyl acetate and precipitating and filtering the salt. After dispersing the solid in cyclohexane, the unremoved salt was removed finally through column chromatography. After obtaining a finally purified reaction solution through column chromatography and removing the solvent by evaporation, a thiol-based silane monomer protected with a TBDMS (tert-butyldimethylsilyl) group (protected 3-MPTMS, hereinafter also referred to as a 'first monomer') (54.66 g, 0.176 mol) was obtained. The yield was 86.38%.

Figure 3A:
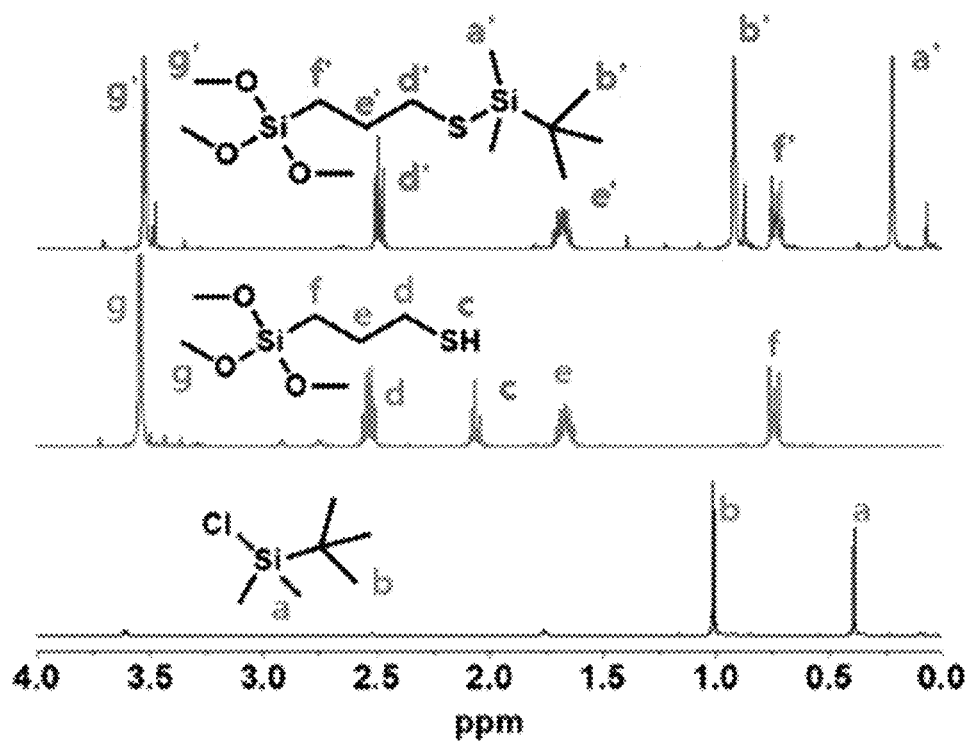
FIG. 3A shows the $^1$H NMR spectra of TBSCl, 3-MPTMS and a thiol-based silane monomer protected with a TBDMS (tert-butyldimethylsilyl) group (protected 3-MPTMS, first monomer) in a $CDCl_3$ solvent.
Figure 3B:
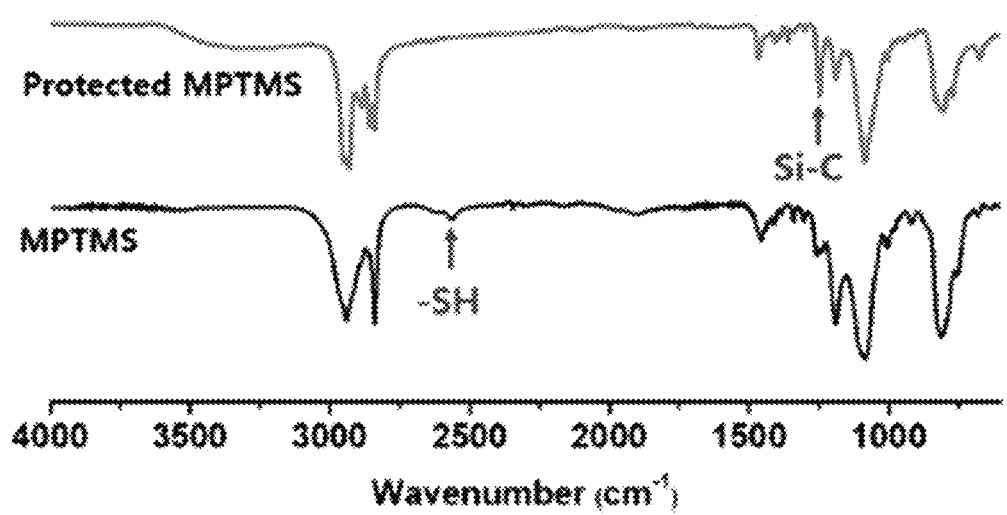
FIG. 3B shows the FTIR spectra of 3-MPTMS and a thiol-based silane monomer protected with a TBDMS (tert-butyldimethylsilyl) group (protected 3-MPTMS, first monomer).

FIG. 3A shows the $^1$H NMR spectra of TBSCl, 3-MPTMS and the thiol-based silane monomer protected with a TBDMS (tert-butyldimethylsilyl) group (protected 3-MPTMS, first monomer) in a CDCl$_3$ solvent, and FIG. 3B shows the FTIR spectra of 3-MPTMS and the thiol-based silane monomer protected with a TBDMS (tert-butyldimethylsilyl) group (protected 3-MPTMS, first monomer).

$^1$H-NMR (400 MHz, CDCl$_3$): δ 0.22 (6H, s, Si(CH$_3$)$_2$), 0.73 (2H, t, CH$_2$), 0.92 (9H, s, SiC(CH$_3$)$_3$), 1.68 (2H, m, CH$_2$), 2.49 (2H, t, CH$_2$), 3.53 (9H, s, SiO(CH$_3$)$_3$). $^{13}$C-NMR (75 MHz, CDCl$_3$): δ −3.67, 8.53, 18.83, 26.27, 29.34, 50.33. FT-IR (KBr): 2566 cm$^{-1}$ (S—H stretching).

From FIGS. 3A and 3B, it can be seen that the —SH peak at 2 ppm disappeared completely after the protection with the TBDMS (tert-butyldimethylsilyl) group, suggesting that the thiol group of the ladder-like polysilsesquioxane copolymer is completely protected by the TBDMS (tert-butyldimethylsilyl) group quantitatively.

Example 2-1. Synthesis of LAThPSQ55 Copolymer

[Scheme 2]

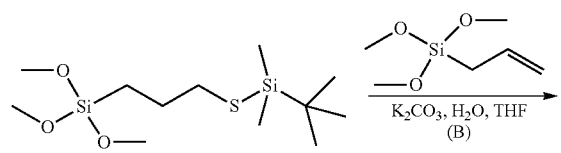

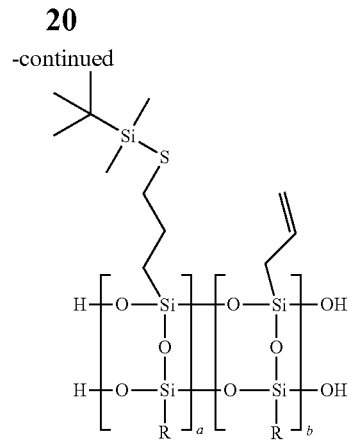

(In Scheme 2, R is a mercaptopropyl group or an allyl group, and each of a and b is independently an integer from 1 to 10,000.)

A LAThPSQ copolymer was prepared according to Scheme 2. The first monomer (protected 3-MPTMS) (0.04 mol) prepared in Example 1-1 was mixed with THF (8 g) and allyl TMS (allyl trimethoxysilane) (6.49 g, 0.04 mol) was added thereto. After adding an aqueous potassium carbonate solution [0.04 g (0.289 mmol) of potassium carbonate mixed with 4.8 g (267 mmol) of distilled water] to the clear mixture solution, the mixture was stirred at room temperature. The reaction was stopped when molecular weight was not increased any more when measured by gel permeation chromatography (GPC) and the reaction solution was recovered. When the reaction was completed, the LAThPSQ copolymer needed to be separated from the solvent because the LAThPSQ copolymer had a highly viscous liquid state. For this, methanol (MeOH) was added to the reaction solution and the solvent was removed through decantation. The precipitate was dissolved in methylene chloride (50 mL) and then extracted 3 times with the same amount of distilled water. MgSO$_4$ was added to the methylene chloride solution from which the distilled water was removed and then stirred overnight to remove moisture. The methylene chloride solution was filtered to remove MgSO$_4$ and, finally, a highly viscous liquid (LAThPSQ55 copolymer) was obtained through evaporation. The yield was 86.3%.

$^1$H-NMR (400 MHz, CDCl$_3$): δ 0.25 (6H, s, Si(CH$_3$)$_2$), 0.75 (2H, m, CH$_2$), 0.95 (9H, s, SiC(CH$_3$)$_3$), 1.62-1.68 (4H, m, CH$_2$), 2.52 (2H, m, CH$_2$), 4.95-4.99 (2H, m, CH$_2$), 5.76 (1H, m, CH). $^{13}$C-NMR (75 MHz, CDCl$_3$): δ −3.31, 19.07, 26.53, 29.65, 115.48, 132.21. $^{29}$Si-NMR (59.6 MHz, CDCl$_3$): δ −68, −72. FT-IR (KBr): 1633 cm$^{-1}$ (C=C stretching), 898-931 cm$^{-1}$ (C—H out-of-plane bending).

Example 2-2. Synthesis of LAThPSQ73 Copolymer

A LAThPSQ73 copolymer was prepared in the same manner as in Example 2-1 except that 0.056 mol of the first monomer (protected 3-MPTMS) prepared in Example 1-1 was mixed with 0.024 mol of allyl TMS (mixing molar ratio of the first monomer and allyl TMS=70:30).

Example 2-3. Synthesis of LAThPSQ37 Copolymer

A LAThPSQ37 copolymer was prepared in the same manner as in Example 2-1 except that 0.024 mol of the first monomer (protected 3-MPTMS) prepared in Example 1-1 was mixed with 0.056 mol of allyl TMS (mixing molar ratio of the first monomer and allyl TMS=30:70).

Comparative Example 2-1. Synthesis of LAPSQ100 Copolymer

A LAPSQ copolymer was prepared in the same manner as in Example 2-1 except that only 0.08 mol of the first monomer (protected 3-MPTMS) prepared in Example 1-1 was used (mixing molar ratio of the first monomer and allyl TMS=100:0).

Comparative Example 2-2. Synthesis of LThPSQ100 Copolymer

A LThPSQ copolymer was prepared in the same manner as in Example 2-1 except that only 0.08 mol of allyl TMS was used (mixing molar ratio of the first monomer and allyl TMS=0:100).

Comparative Example 2-3. Synthesis of LthPSQ Copolymer

A LthPSQ copolymer was prepared in the same manner as in Example 2-1 except that only 0.08 mol of (3-mercaptopropyl)trimethoxysilane was used instead of the first monomer (protected 3-MPTMS) prepared in Example 1-1 (mixing molar ratio of the first monomer and allyl TMS=100:0).

Comparative Example 2-4. Synthesis of LAthPSQ55 Copolymer

A LthPSQ copolymer was prepared in the same manner as in Example 2-1 except that 0.04 mol of (3-mercaptopropyl)trimethoxysilane instead of the first monomer (protected 3-MPTMS) prepared in Example 1-1 was mixed with 0.04 mol of allyl TMS (mixing molar ratio of the first monomer and allyl TMS=50:50).

Example 3-1. Deprotection and Patterning of Printed Circuit Board

The LAThPSQ55 copolymer prepared in Example 2-1 was used for patterning of a printed circuit board as shown in FIG. 2. First, after mixing the LAThPSQ55 copolymer prepared in Example 2-1 (1 thiol eq.) with 2 equivalents of TFA (2eq.) in 30 wt % methylene chloride, the mixture was stirred at room temperature for 30 minutes. The photoinitiator TPO-L (2,4,6-trimethylbenzoyldiphenyl phosphinate) was added to the mixture solution. The addition amount of TPO-L was 0.3 part by weight based on the total weight (1 part by weight) of LAThPSQ55. After mixing for 5 minutes, a composition for plating patterning was prepared by syringe-filtering using a filter with a pores size of 0.2 μm.

After preparing the surface of a PI film with acetone, the composition for plating patterning was coated on one side of the PI film using a bar coater with a gauge set to 50 μm (step A, coating). In order to adhere the PI film to the LAThPSQ55 copolymer of Example 2-1 and remove the protecting group and TFA, heat treatment was performed in an oven at 120° C. for 10 minutes (step B, heating). After that, the patterning mask was covered on the film and a patterned film was prepared by irradiating UV at a dosage of 500 mW/cm$^2$ (step C, patterning). The patterned film was subjected to electroless plating immediately without a separate washing procedure (step D, pattern formation).

The electroless plating was performed in the order of treatment with a Pd colloid catalyst, washing with water, acceleration, washing with water and electroless Cu plating. First, an electroless metal plating solution was prepared by mixing 25 mL of a Pd—Sn colloidal solution, 375 mL of triply distilled water and 100 mL of 1 M hydrochloric acid. To the electroless metal plating solution, the patterned film was submerged for 5 minutes at room temperature to obtain a film with an electroless metal plating layer formed (Pd/Sn seeding step). The film was washed with a copious amount of triply distilled water (deionized water). After preparing an aqueous sulfuric acid solution by mixing 375 mL of triply distilled water with 50 mL of sulfuric acid, the film with the electroless metal plating layer formed was submerged therein for 30 minutes and then washed again with a copious amount of triply distilled water (Sn removal step). Caution is necessary because this step evolves substantial heat. After taking out the patterned film and washing with water, it was submerged in 360 mL of a Cu-precipitating solution heated to 36° C. for 1 hour. Finally, after taking out the patterned film and wiping excess water with Kimwipes, a patterned substrate was obtained by drying at room temperature.

Test Example 1. Yield of Thiol-Based Silane Monomers Protected with TBDMS (tert-butyldimethylsilyl) Group (protected 3-MPTMS) Depending on Solvents Thiol-based silane monomers protected with a TBDMS (tert-butyldimethylsilyl) group (protected 3-MPTMS) were prepared as described in Table 1 instead of mixing TBSCl (tert-butyldimethylsilyl chloride, Aldrich, 97%) (46.05 g, 0.305 mol), DMF (100 g)/CAN (1000 g) and Et$_3$N (triethylamine, Aldrich, 99.5%) (37.10 g, 0.366 mol) in Example 1 (Examples 1-2 to 1-10 and Comparative Examples 1-1 to 1-4).

The yield of the thiol-based silane monomers protected with a TBDMS (tert-butyldimethylsilyl) group are shown in Table 1.

TABLE 1

|  | Solvent | Et$_3$N | TBSCl | Yield (%) |
| --- | --- | --- | --- | --- |
| Comparative Example 1-1[a] | DMF-d$_7$ | 2.5 mol | 1.2 mol | — |
| Comparative Example 1-2 | CDCl$_3$ | — | 1.2 mol[c] | X |
| Comparative Example 1-3 | CDCl$_3$ | 1.2 mol | 1.2 mol | X |
| Comparative Example 1-4 | DMF-d$_7$ | — | 1.2 mol | x |

TABLE 1-continued

|  | Solvent | Et$_3$N | TBSCl | Yield (%) |
|---|---|---|---|---|
| Example 1-2 | CDCl$_3$ | 2.4 mol | 1.2 mol | 12.2 |
| Example 1-3 | DMF-d$_7$ | 1.2 mol | 1.2 mol | 20.0 |
| Example 1-4 | DMF-d$_7$ | 2.4 mol | 1.2 mol | 51.0 |
| Example 1-5 | ACN-d$_3$/DMF [b] | 1.8 mol | 1.5 mol [d] | 99.6 |
| Example 1-6 | THF-d$_8$/DMF | 1.8 mol | 1.5 mol | 39.1 |
| Example 1-7 | CDCl$_3$/DMF | 1.8 mol | 1.5 mol | 75.0 |
| Example 1-8 | CDCl$_3$_Imidazole 2 mol % | 1.2 mol | 1.2 mol | 35.5 |
| Example 1-9 | CDCl$_3$_Imidazole 4 mol % | 1.2 mol | 1.2 mol | 40.3 |
| Example 1-10 | CDCl$_3$_Imidazole 10 mol % | 1.2 mol | 1.2 mol | 44.0 |

[a]Synthesized with (3-mercaptopropyl)trimethoxysilane.
[b] Synthesized with (3-mercaptopropyl)trimethoxysilane and allyl trimethoxysilane at 50:50.
[c]Calculated by $^1$H-NMR integrated ratios.

As shown in Table 1, the thiol-based silane monomer protected with a TBDMS (tert-butyldimethylsilyl) group (protected 3-MPTMS) could not be obtained when only CDCl$_3$ was used as an organic solvent or when Et$_3$N was not added in the step A of protecting the thiol-based silane monomer (3-MPTMS) with a TBDMS (tert-butyldimethylsilyl) group.

When only CDCl$_3$ or DMF-d$_7$ was used as a solvent, the yield could be increased by increasing the molar ratio of Et$_3$N and TBSCl to 2:1.

Specifically, in the step of protecting the thiol-based silane monomer (3-MPTMS) with a TBDMS (tert-butyldimethylsilyl) group, a preferred solvent may be a mixture solvent of two or more solvents selected from a group consisting of CDCl$_3$, DMF, ACN, THF and imidazole, more specifically a mixture solvent of DMF and CAN or DMF and CDCl$_3$, most specifically a mixture solvent of DMF and ACN.

And, the mixing ratio of the mixture solvent may be 1:1 to 1:20, specifically 1:5 to 1:15, more specifically 1:9 to 1:11, most specifically 1:10, based on weight.

In addition, the mixing molar ratio of Et$_3$N and TBSCl may be 0.5:1 to 5:1, specifically 1:1 to 2:1, more specifically 1.0:1 to 1.5:1, most specifically 1.2:1.

A yield of 85-99.9% could be attained when all of the above conditions were satisfied, as shown in Table 1.

Test Example 2. Characteristics of Polysilsesquioxane Copolymers Synthesized with Different Mixing Molar Ratios 1

The polysilsesquioxane copolymers prepared in Examples 2-2 to 2-4 and Comparative Example 2-2 were used. The LAThPSQ copolymers of Examples 2-2 to 2-4 and Comparative Example 2-2 (LAThPSQ73, LAThPSQ55, LAThPSQ37 and LThPSQ100) were subjected to $^1$H NMR and FTIR measurements, and the result is shown in FIGS. 4A and 4B.

Figure 4A:
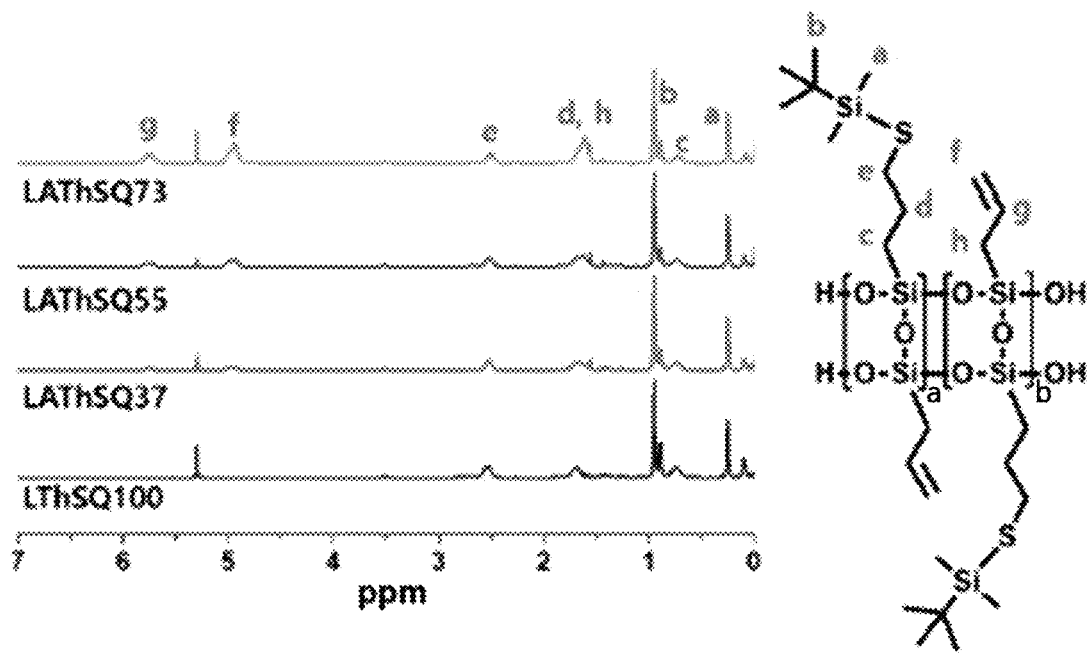
FIG. 4A shows the $^1$H NMR spectra of LAThPSQ copolymers of Examples 2-2 to 2-4 and Comparative Example 2-2 (LAThPSQ73, LAThPSQ55, LAThPSQ37 and LThPSQ100).
Figure 4B:
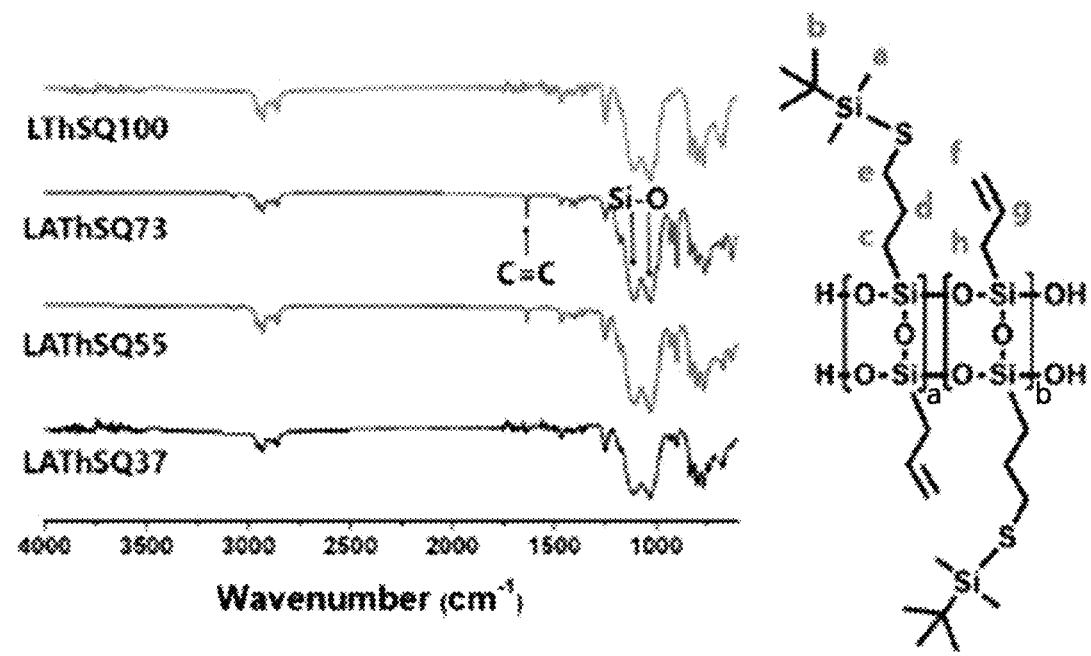
FIG. 4B shows the FTIR spectra of LAThPSQ copolymers of Examples 2-2 to 2-4 and Comparative Example 2-2 (LAThPSQ73, LAThPSQ55, LAThPSQ37 and LThPSQ100).

FIG. 4A shows the $^1$H NMR spectra of the LAThPSQ copolymers of Examples 2-2 to 2-4 and Comparative Example 2-2 (LAThPSQ73, LAThPSQ55, LAThPSQ37 and LThPSQ100), and FIG. 4B shows the FTIR spectra of the LAThPSQ copolymers of Examples 2-2 to 2-4 and Comparative Example 2-2 (LAThPSQ73, LAThPSQ55, LAThPSQ37 and LThPSQ100).

The polysilsesquioxane copolymers prepared in Examples 2-2 to 2-4 and Comparative Example 2-2 had ladder structures, and specific chemical structures were identified from the $^1$H NMR and FTIR spectra of FIGS. 4A and 4B.

For the polysilsesquioxane copolymers prepared in Examples 2-2 to 2-4 and Comparative Example 2-2, structural defect was not observed in the peaks because a thiolene reaction did not occur since the thiol group remained being protected by the protecting group. In addition, it was found out that the thiol functional group and the allyl functional group exist in the polysilsesquioxane copolymers at quantitative monomer composition (FIG. 4A). In addition, the allyl functional group was nonexistent or present in trace amounts in the polysilsesquioxane copolymers of Example 2-4 and Comparative Example 2-2 (FIG. 4A).

The Si—O—Si bonding in the polysilsesquioxane copolymers of Examples 2-2 to 2-4 and Comparative Example 2-2 were confirmed through FTIR analysis (FIG. 4B). Specifically, the siloxane bonding vibration band was identified as double peaks (1050 cm$^{-1}$, 1150 cm$^{-1}$), and unsaturated hydrocarbon carbons representing an allyl functional group were found at 1640 cm$^{-1}$. In addition, it was confirmed that the allyl functional group is nonexistent or present in trace amounts in the polysilsesquioxane copolymers of Example 2-4 and Comparative Example 2-2 (FIG. 4B).

Through the $^1$H NMR and FTIR analyses, it was confirmed that, although all the polysilsesquioxane copolymers of Examples 2-2 to 2-4 and Comparative Example 2-2 had ladder structures, the presence of the thiol functional group and the allyl functional group becomes entirely different depending on the mixing molar ratio of the monomers.

Test Example 3. Characteristics of Polysilsesquioxane Copolymers Synthesized with Different Mixing Molar Ratios 2

The polysilsesquioxane copolymers prepared in Examples 2-2 to 2-4 and Comparative Examples 2-1 to 2-4 were used. In Comparative Example 2-3 and Comparative Example 2-4, (3-mercaptopropyl)trimethoxysilane was used instead of the first monomer.

The yield, molar ratio of functional groups and molecular weight of the polysilsesquioxane copolymers prepared in Examples 2-2 to 2-4 and Comparative Examples 2-1 to 2-4 were analyzed and the result is shown in Table 2.

TABLE 2

| | | Molar ratio of functional groups (mol %) | | | | | |
|---|---|---|---|---|---|---|---|
| | | Experiment ratio | | Observed ratio[c] | | Analysis data | |
| | Yield | Allyl | Thiol | Allyl | Thiol | Mw[d] | PDI[e] |
| Comparative Example 2-1 LAPSQ 100 | — | 100 | — | — | — | — | — |
| Example 2-2 LAThPSQ 73 | 83.5% | 70 | 30 | 70 | 30 | 15,900 | 4.36 |
| Example 2-1 LAThPSQ 55 | 86.3% | 50 | 50 | 56 | 44 | 32,200 | 6.49 |
| Example 2-3 LAThPSQ 37 | 87.5% | 30 | 70 | 40 | 60 | 17,500 | 4.35 |
| Comparative Example 2-2 LThPSQ 100 | 89.0% | — | 100 | — | 100 | 27,300 | 5.85 |
| Comparative Example 2-3 LthPSQ 100[a] | — | — | 100 | — | — | — | — |
| Comparative Example 2-4 LAthPSQ 55[b] | — | 50 | 50 | — | — | 43,900 | 7.30 |

[a]Synthesized with (3-mercaptopropyl)trimethoxysilane.
[b]Synthesized with (3-mercaptopropyl)trimethoxysilane and Allyl trimethoxysilane as 50:50 ratio.
[c]Calculated by ¹H-NMR integrated ratios.
[d]Analyzed by GPC.
[e]Polydispersity Index ($M_w/M_n$).

The polysilsesquioxane copolymers having ladder structures were prepared with various molar ratios of monomers as shown in Table 2 and their molecular weight and stoichiometric ratios were analyzed. As a result, it was confirmed that all the polysilsesquioxane copolymers prepared in Examples 2-2 to 2-4 are suitable as compositions for forming the pattern of a printed circuit board. However, it was found that, among the polysilsesquioxane copolymers prepared in Examples 2-2 to 2-4, LAThPSQ55 (Example 2-1) is the most preferred because it can be completely cured upon exposure to UV and has a large molecular weight. The synthesized LAThPSQ55 (Example 2-1) was a polymer material having a number-average molecular weight of 30,000 or higher.

Test Example 4. Change in Chemical Structure of LAThPSQ55 Copolymer Upon Exposure to UV The change in the chemical structure of the LAThPSQ55 copolymer prepared in Example 2-1 when a plating pattern is formed (steps A and B) was investigated. For this, a sample was prepared by coating the LAThPSQ55 copolymer prepared in Example 2-1 on a Si wafer and forming a plating pattern.

First, a composition for plating patterning was prepared by mixing the LAThPSQ55 copolymer prepared in Example 2-1 (1 thiol eq.) and two equivalents of TFA (2eq.) in 30 wt % methylene chloride and adding the photoinitiator TPO-L (2,4,6-trimethylbenzoyldiphenyl phosphinate). After forming a bar-shaped pattern by coating the composition on one side of a Si wafer washed with acetone using a bar coater (step A, coating), the wafer was heat-treated in an oven at 120° C. for 120 minutes (step B, heating). Then, after covering a patterning mask on the wafer, a patterned wafer was prepared by irradiating UV with a dosage of 500 mW/cm² (step C, curing by exposure to UV). After the steps A, B and C, the sample was subjected to FTIR analysis.

Figure 5A:
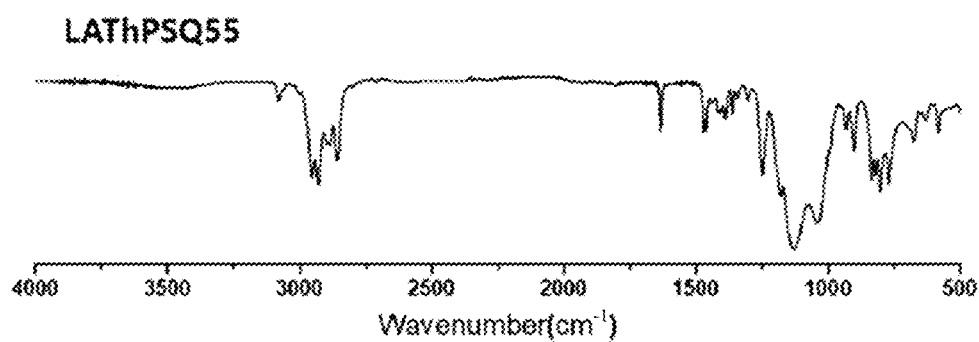
FIG. 5A shows the FTIR spectrum of a LAThPSQ55 copolymer prepared in Example 2-1 measured immediately after coating on a Si wafer.
Figure 5B:
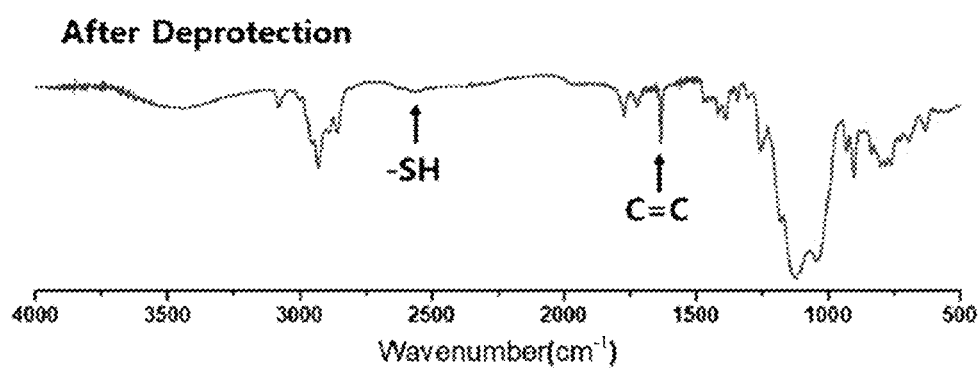
FIG. 5B shows the FTIR spectrum of a LAThPSQ55 copolymer prepared in Example 2-1 measured after coating on a Si wafer and heating at 120° C. for 120 minutes.
Figure 5C:
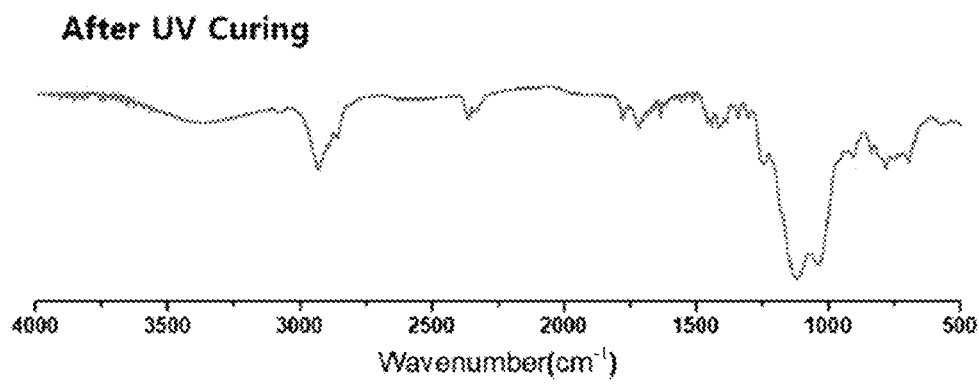
FIG. 5C shows the FTIR spectrum of a LAThPSQ55 copolymer prepared in Example 2-1 after coating on a Si wafer, heating (120° C., 120 minutes) and curing by exposure to UV.

FIG. 5A shows the FTIR spectrum of the LAThPSQ55 copolymer prepared in Example 2-1 measured immediately after coating on the Si wafer, FIG. 5B shows the FTIR spectrum of the LAThPSQ55 copolymer prepared in Example 2-1 measured after coating on the Si wafer and heating at 120° C. for 120 minutes, and FIG. 5C shows the FTIR spectrum of the LAThPSQ55 copolymer prepared in Example 2-1 after coating on the Si wafer, heating (120° C., 120 minutes) and curing by exposure to UV.

As shown in FIG. 5, the peak of the thiol functional group (2550 cm¹), which was absent after the simple coating of the LAThPSQ55 copolymer prepared in Example 2-1, appeared distinctly after the heating at 120° C. This suggests that the protecting group was successfully removed by the heat treatment at 120° C. and the thiol functional group was activated.

The disappearance of the thiol functional group peak and the allyl functional group peak in FIG. 5C confirms that a thiol-ene click reaction was performed successfully in the LAThPSQ55 copolymer of Example 2-1 upon exposure to UV.

When considering the stereospecific nature of the thiol-ene click reaction, it can be seen that the structure shown in FIG. 6 is formed by curing of the LAThPSQ55 copolymer of Example 2-1 upon exposure to UV. In FIG. 6, each of a and b may be selected from 1 to 10,000, and R indicates a bond between a thioether bridge and a propyl linkage formed by the thiol-ene click reaction with another LAThPSQ55 copolymer.

The LAThPSQ55 copolymer not exposed to UV acts as a seed layer for metal plating because the thiol group and the allyl group remain intact without forming a bond between the thioether bridge and the propyl linkage.

Test Example 5. Thermal Properties of LAThPSQ55 Copolymer

FIG. 7 shows the TGA analysis result of the LAThPSQ55 copolymer prepared in Example 2-1 and the LAThPSQ55 copolymer prepared in Example 2-1 after coating on a Si wafer, heating (120° C., 10 minutes) and curing by exposure to UV.

For a flexible copper-clad laminate, a low dielectric constant and thermal stability are very important factors. From FIG. 7, it can be seen that the LAThPSQ55 copolymer prepared in Example 2-1 of the present disclosure is suitable for preparation of a flexible copper-clad laminate because it has a very high glass transition temperature or melting temperature.

Prior to UV exposure, the LAThPSQ55 copolymer of Example 2-1 showed superior thermal stability at high temperatures, with less than 1 wt % of weight less at 300° C. and less than 5 wt % of weight less at 370° C.

It was confirmed that the LAThPSQ55 copolymer cured by UV exposure shows less than 5 wt % of weight less up to 370° C.

Test Example 6. Thermal Properties of LAThPSQ55 Copolymer

The LAThPSQ55 copolymer was photopatterned using patterning masks of various sizes and shapes according to the procedure of Example 3-1. Copper plating patterns were prepared using square patterning masks with sizes of 7 μm$^2$ and 70 μm$^2$, and then copper plating patterns with linewidths of 6, 5, 4 and 2 μm were prepared using linear patterning masks. Then, SEM measurement was made.

Figure 8A:
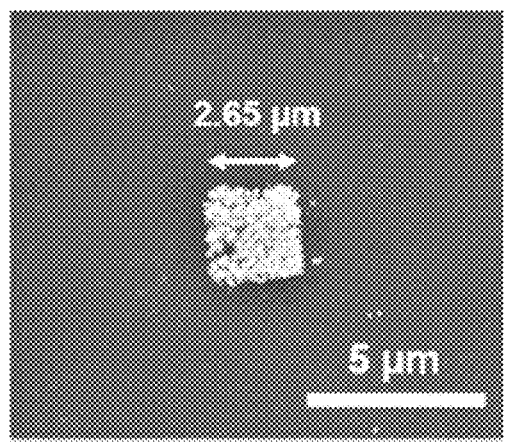
FIGS. 8A to 8C show the SEM images of plating patterns prepared in Example 3-1 using various patterning masks (square patterns with sizes of 7 μm$^2$ and 70 μm$^2$).
Figure 8B:
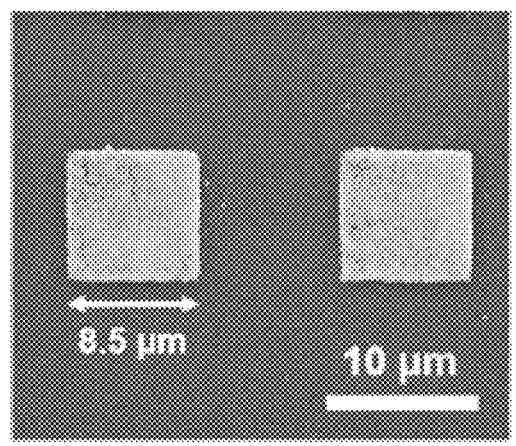
Figure 8C:
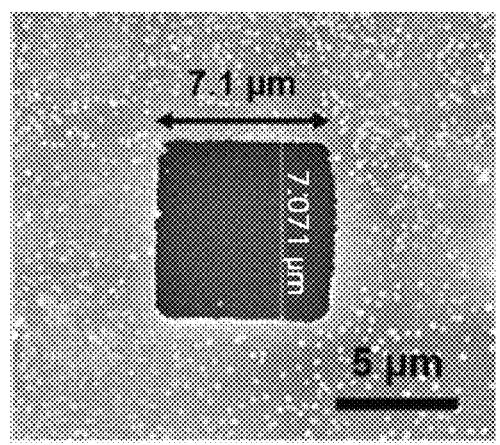

FIGS. 8A to 8C show the SEM images of the plating patterns prepared in Example 3-1 using various patterning masks (square patterns with sizes of 7 μm$^2$ and 70 μm$^2$). FIG. 8A shows the plating pattern prepared from the square patterning mask with a size of 7 μm$^2$, FIG. 8B shows the plating pattern prepared from the square patterning mask with a size of 70 μm$^2$, and FIG. 8C shows the positive plating pattern prepared from the square patterning mask with a size of 70 μm$^2$.

As shown in FIGS. 8A to 8C, it was confirmed that the square plating patterns with sizes of 7 μm$^2$ and 70 μm$^2$ were densely packed and well-defined. It can be seen that the LAThPSQ55 copolymer of the present disclosure may be utilized to form both negative and positive plating patterns accurately through simple lithographic processing without a copper etching process.

From these results, it can be seen that the minimum linewidth (feature size) of the pattern that can be formed with the plating patterning method of the present disclosure is 3-8 μm.

Figure 9A:
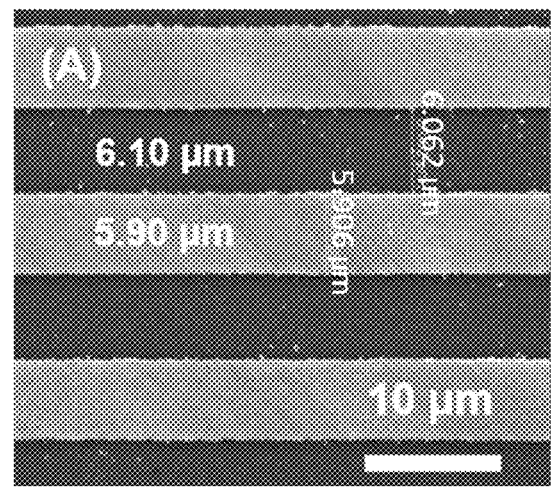
FIGS. 9A to 9D show the SEM images of patterns prepared in Example 3-1 using various linear patterning masks (line patterns having linewidths of 2, 4, 5 and 6 μm).
Figure 9B:
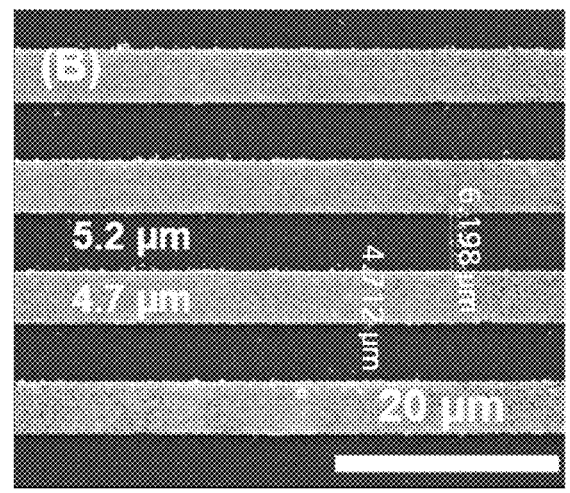
Figure 9C:
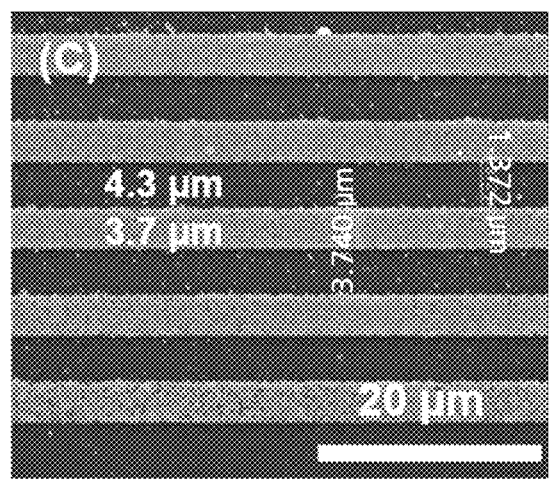
Figure 9D:
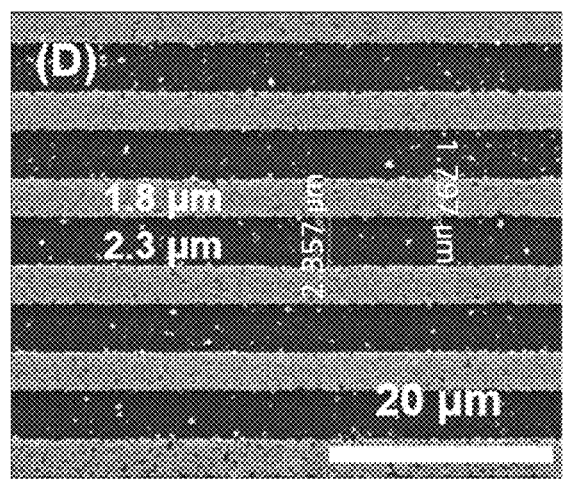

FIGS. 9A to 9D show the SEM images of the patterns prepared in Example 3-1 using various linear patterning masks (line patterns having linewidths of 2, 4, 5 and 6 μm). FIG. 9A shows the plating pattern prepared from a line patterning mask with a linewidth of 6 μm, FIG. 9B shows the plating pattern prepared from a line patterning mask with a linewidth of 5 μm, FIG. 9C shows the plating pattern prepared from a line patterning mask with a linewidth of 4 μm linewidth, and FIG. 9D shows the plating pattern prepared from a line patterning mask with a linewidth of 2 μm.

As shown in FIGS. 9A to 9D, copper plating was formed well in all the plating patterns. In particular, the plating pattern with a linewidth of 4 μm showed a porous-like structure.

Therefore, it was confirmed that the minimum linewidth (feature size) of the pattern that can be formed with the plating patterning method of the present disclosure is 4 μm.

Figure 10A:
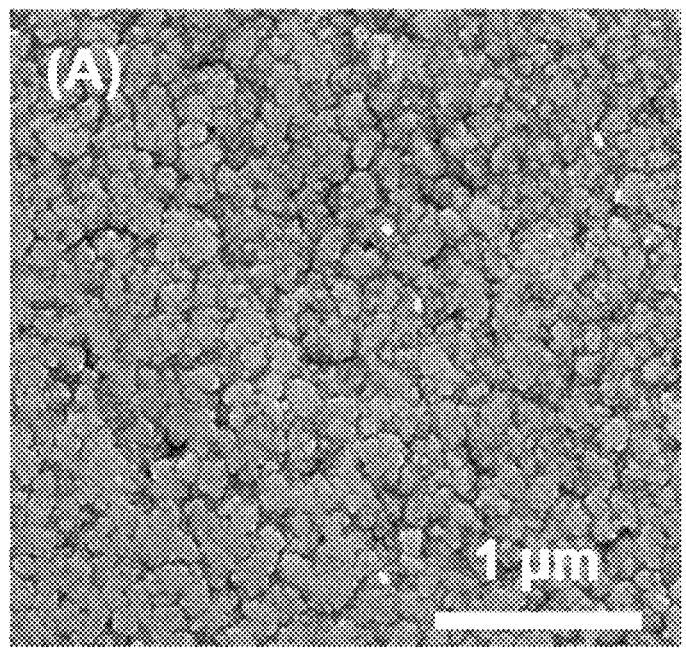
FIGS. 10A and 10B show the enlarged SEM images of plating patterns prepared in Example 3-1 using a line patterning mask with a linewidth of 4 μm (FIG. 10A) and a line patterning mask with a linewidth of 2 μm (FIG. 10B).
Figure 10B:
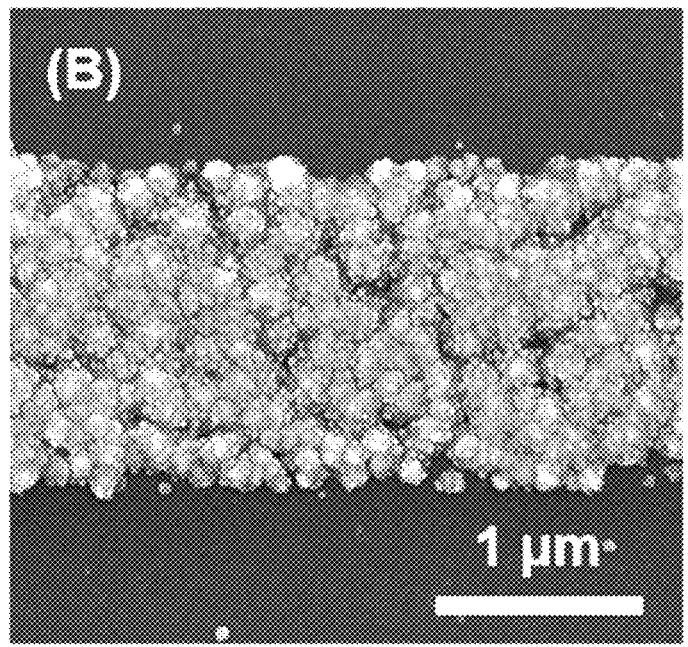

FIGS. 10A and 10B show the enlarged SEM images of the plating patterns prepared in Example 3-1 using a line patterning mask with a linewidth of 4 μm (FIG. 10A) and a line patterning mask with a linewidth of 2 μm (FIG. 10B).

As shown in FIGS. 10A and 10B, the plating pattern of Example 3-1 prepared with a linewidth of 4 μm showed very high copper packing density without microvoids, cracks or defects. This was in contrast to the plating pattern prepared with a linewidth of 2 μm. These results further affirmed that the minimum linewidth (feature size) of a pattern that can be achieved with the plating pattern formation method of the present disclosure is 4 μm.

Test Example 7. Dielectric Constant of LAThPSQ55 Copolymer

Polymethylsilsesquioxane with a general structure has a low dielectric constant of 2.7-2.9 due to the low polarization of the Si-methyl functional group. It was expected that the LAThPSQ55 copolymer of the present disclosure would have a higher dielectric constant owing to the thioether bridge and propyl linkage formed by the thiol-ene click reaction.

Figure 11:
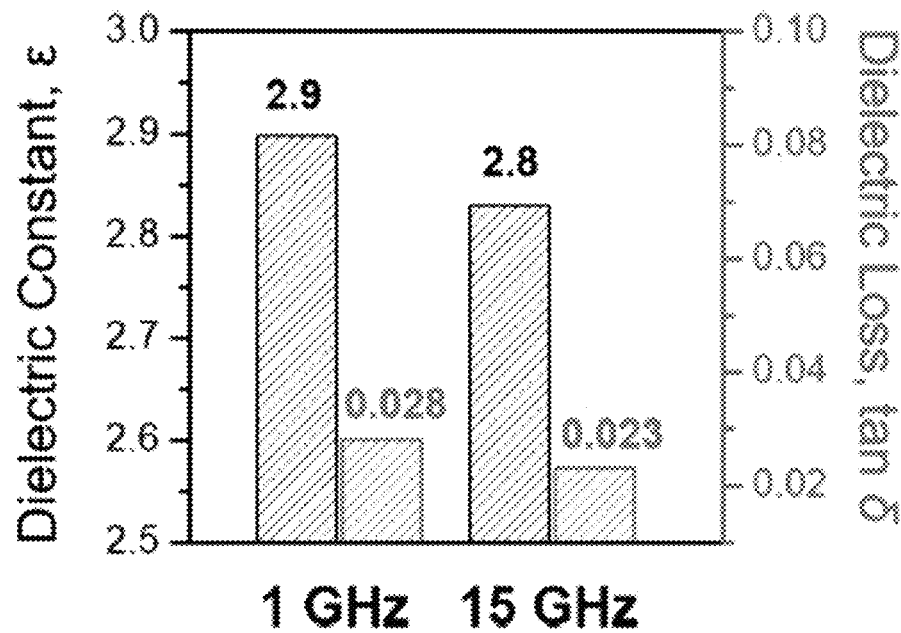
FIG. 11 shows the dielectric constant and dielectric loss of a LAThPSQ55 copolymer measured under the condition of 1 GHz and 15 GHz after coating on a Si wafer, heating (120° C., 10 minutes) and curing by exposure to UV.

FIG. 11 shows the dielectric constant and dielectric loss of the LAThPSQ55 copolymer measured under the condition of 1 GHz and 15 GHz after coating on a Si wafer, heating (120° C., 10 minutes) and curing by exposure to UV.

As shown in FIG. 11, the dielectric constant was very low with 2.9 at 1 GHz and 2.8 at 15 GHz. Moreover, the dielectric loss was sufficiently low as 0.028 and 0.023, respectively. These levels were on par with those of the current commercial epoxy-based low dielectric materials.

Test Example 8. Surface Resistance of Platina Pattern Prepared with LAThPSQ55 Copolymer In addition, surface resistance is a very important factor in electroless copper plating.

Figure 12:
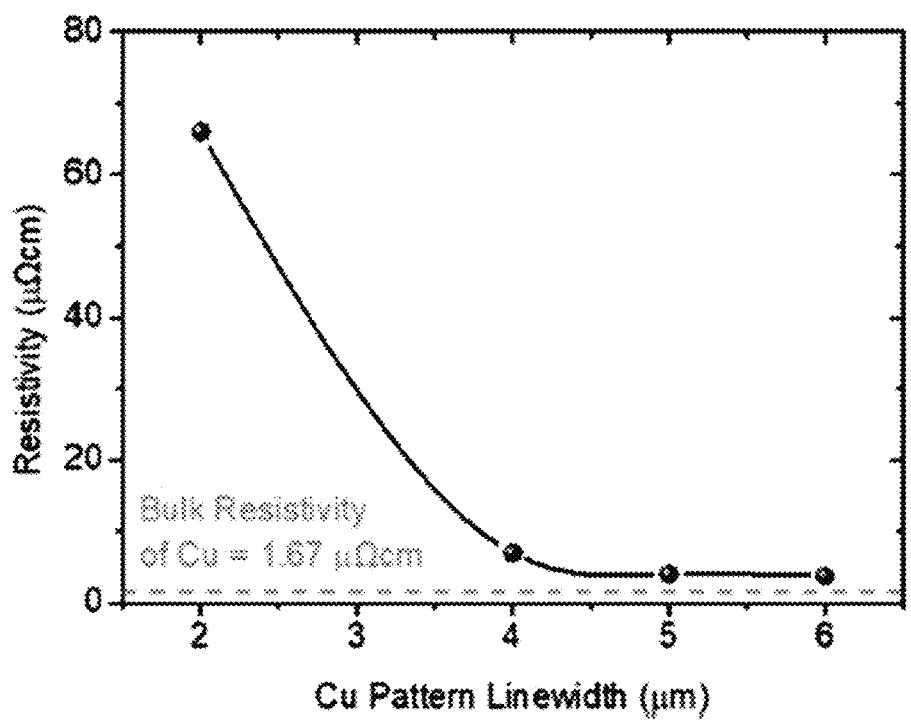
FIG. 12 shows the surface resistivity of plating patterns prepared in Example 3-1 using various linear patterning masks (line patterns with linewidths of 4, 5 and 6 μm).

FIG. 12 shows the surface resistivity of the plating patterns prepared in Example 3-1 using various linear patterning masks (line patterns with linewidths of 4, 5 and 6 μm).

As shown in FIG. 12, the plating patterns with linewidths of 4, 5 and 6 μm exhibited surface resistivity of 7 μΩcm, 4 μΩcm and 3.8 μΩcm, respectively. When compared to the known bulk resistivity of a general copper plating pattern of 1.67 μΩcm, it can be seen that the LAThPSQ55 copolymer of the present disclosure forms a plating pattern smoothly with high density without significant resistance or cracking when applied to preparation of a printed circuit board.

Test Example 9. Surface Roughness of Platina Pattern Prepared with LAThPSQ55 Copolymer FIGS. 13A and 13B shows the AFM images of the LAThPSQ55 copolymer prepared in Example 3-1 and a PI film.

Skin effect is the phenomenon whereby a signal is transmitted near the surface of a conductor at high frequencies. Signal transmission is greatly affected by the surface state. Therefore, the improvement of the surface roughness of a copper film is important to remove the skin effect at high frequencies.

Figure 13A:
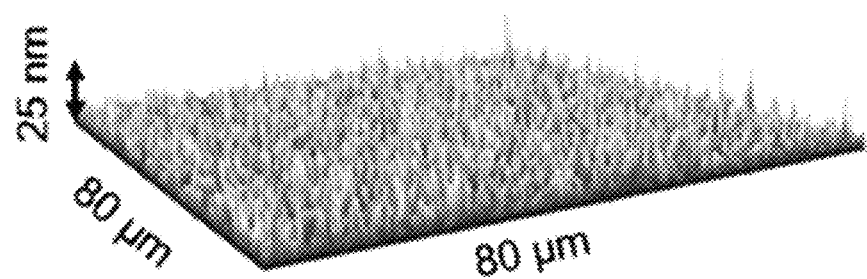
FIGS. 13A and 13B show the AFM images of a LAThPSQ55 copolymer prepared in Example 3-1 and a PI film.
Figure 13B:
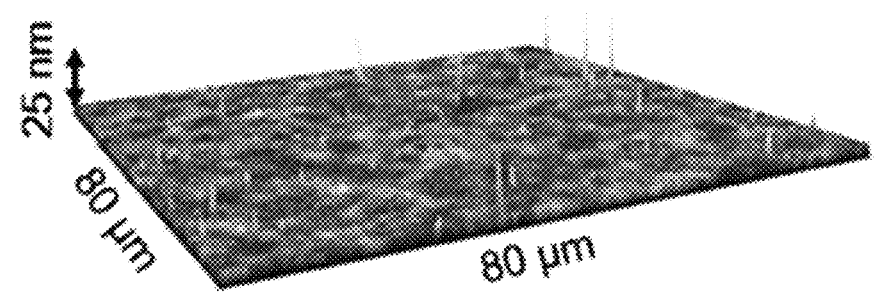

As shown in FIGS. 13A and 13B, the surface roughness (Ra) of a polyimide film was 2.43 nm. When the LAThPSQ55 copolymer prepared in Example 2-1 was coated thereon, the surface roughness (Ra) was improved substantially to 0.43 nm. This was approximately ⅕ of the surface roughness of the polyimide film.

For reference, the surface roughness (Ra) of a commercial available copper film is 7-8 nm (Fukuda, T9DA). When compared with this, it can be seen that superior surface roughness characteristics can be attained by using the LAThPSQ55 copolymer of the present disclosure.

In conclusion, the present disclosure can present a new methodology for the fabrication of printed circuit board interconnects using a combination of photolithography and electroless plating using the LAThPSQ copolymer without any complicated etching process. Since the LAThPSQ copolymer contains a thiol functional group and an allyl functional group at the same time, selective pattern can be formed easily on a substrate through exposure to UV. In addition, since the UV-cured LAThPSQ copolymer exhibits high thermal stability, a superior dielectric constant and low dielectric loss, it exhibits superior characteristics in plating patterning.

What is claimed is:

1. A ladder-like polysilsesquioxane copolymer having a thiol group and an ene group protected with a silyl group, which is represented by Chemical Formula 1:

[Chemical Formula 1]

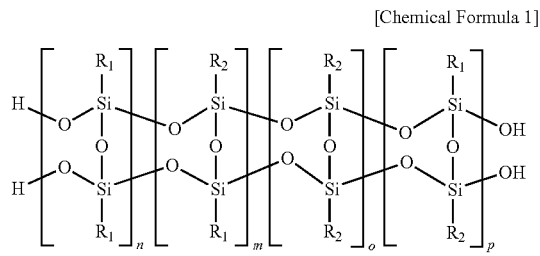

wherein
$R_1$ is selected from an aromatic mercapto group protected with a silyl group and an aliphatic mercapto group protected with a silyl group,
$R_2$ is selected from a substituted or unsubstituted $C_{1-20}$ alkenyl group, a substituted or unsubstituted $C_{1-20}$ alkynyl group, a substituted or unsubstituted $C_{6-30}$ arene group, a substituted or unsubstituted $C_{6-30}$ aryl group and a substituted or unsubstituted $C_{2-15}$ heteroaryl group, and
each of n, m, o and p is independently an integer from 1 to 10,000.

2. The ladder-like polysilsesquioxane copolymer according to claim 1, wherein $R_1$ is selected from a $C_{1-20}$ linear or branched mercaptoalkyl group protected with a silyl group, and $R_2$ is selected from a $C_{1-20}$ alkenyl group.

3. The ladder-like polysilsesquioxane copolymer according to claim 1, wherein $R_1$ is selected from a $C_{1-6}$ mercaptoalkyl group protected with a silyl group, and $R_2$ is selected from a $C_{1-6}$ alkenyl group.

4. The ladder-like polysilsesquioxane copolymer according to claim 1, wherein $R_1$ is selected from a $C_{1-6}$ linear mercaptoalkyl group protected with a silyl group, $R_2$ is selected from $H_2C=C(H)-R_3-*$, and $R_3$ is selected from hydrogen and a $C_{1-6}$ alkyl group.

5. The ladder-like polysilsesquioxane copolymer according to claim 1, wherein, in Chemical Formula 1,
the silyl group of $R_1$ is $R_4R_5R_6Si-*$, which is a protecting group that can be deprotected under a strongly acidic condition, and
each of $R_4$, $R_5$ and $R_6$, which are identical or different from each other, is independently selected from hydrogen, a $C_{1-6}$ linear or branched alkyl group, a $C_{1-5}$ alkoxy group, a cyano group, a $C_{6-30}$ aryl group and a $C_{2-10}$ acyl group.

6. The ladder-like polysilsesquioxane copolymer according to claim 1, wherein the ladder-like polysilsesquioxane copolymer has a number-average molecular weight of 10,000-40,000.

7. The ladder-like polysilsesquioxane copolymer according to claim 1, wherein the ladder-like polysilsesquioxane copolymer has a polydispersity index ($M_w/M_n$) of 4-7.

8. The ladder-like polysilsesquioxane copolymer according to claim 1, wherein the ladder-like polysilsesquioxane copolymer shows a mass loss of less than 5 wt % below 370° C. in thermogravimetric analysis (TGA).

9. An insulation composition comprising: (a) the ladder-like polysilsesquioxane copolymer according to claim 1; (b) an acid; (c) a radical initiator; and (d) an organic solvent.

10. The insulation composition according to claim 9, wherein the acid is selected from a group consisting of phosphoric acid, citric acid, formic acid, acetic acid, trifluoroacetic acid and tetrabutylammonium fluoride.

11. The insulation composition according to claim 9, wherein the organic solvent is one or more selected from a group consisting of tetrahydrofuran (THF), dimethylformamide (DMF), acetonitrile, acetone, methyl ethyl ketone (MEK), methyl isobutyl ketone (MIBK), dimethyl sulfoxide (DMSO), dimethylacetamide (DMAc) and N-methylpyrrolidone (NMP).

12. The insulation composition according to claim 9, wherein the radical initiator is one or more selected from a group consisting of Irgacure 184, Irgacure 369, Irgacure 379, Irgacure 651, Irgacure 819, Irgacure 907, Irgacure 2959, Irgacure OXE01, Lucirin TPO, benzoin methyl ether, benzoin ethyl ether and benzoin isopropyl ether.

* * * * *